(12) United States Patent
Mistkawi et al.

(10) Patent No.: US 11,515,304 B2
(45) Date of Patent: *Nov. 29, 2022

(54) INTEGRATED CIRCUIT DEVICES WITH NON-COLLAPSED FINS AND METHODS OF TREATING THE FINS TO PREVENT FIN COLLAPSE

(71) Applicant: Tahoe Research, Ltd., Dublin (IE)

(72) Inventors: Nabil G. Mistkawi, North Keizer, OR (US); Glenn A. Glass, Portland, OR (US)

(73) Assignee: Tahoe Research, Ltd., Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/032,069

(22) Filed: Sep. 25, 2020

(65) Prior Publication Data
US 2021/0020632 A1 Jan. 21, 2021

Related U.S. Application Data

(63) Continuation of application No. 16/327,033, filed as application No. PCT/US2016/054641 on Sep. 30, 2016, now Pat. No. 10,833,076.

(51) Int. Cl.
*H01L 29/06* (2006.01)
*H01L 27/088* (2006.01)
(Continued)

(52) U.S. Cl.
CPC .... *H01L 27/0886* (2013.01); *H01L 21/02057* (2013.01); *H01L 21/823431* (2013.01);
(Continued)

(58) Field of Classification Search
CPC ........... H01L 27/0886; H01L 21/02057; H01L 21/823431; H01L 27/0207; H01L 29/0653;
(Continued)

(56) References Cited

U.S. PATENT DOCUMENTS 9,012,284 B2   4/2015   Glass et al.
9,165,837 B1  10/2015   Fronheiser et al.
(Continued)

FOREIGN PATENT DOCUMENTS

EP       3171409          5/2017
WO   WO-2015112163 A1 *  7/2015   ......... H01L 21/2255
WO      2018063277 A1    4/2018

OTHER PUBLICATIONS

Notice of Allowance from Taiwan Patent Application No. 106127970, dated Jun. 3, 2021, 3 pgs.
(Continued)

*Primary Examiner* — Samuel Park
(74) *Attorney, Agent, or Firm* — Studebaker & Brackett PC

(57) ABSTRACT

An integrated circuit device with a substrate and a plurality of fins is provided where fin width is less than 11 nanometers, fin height is greater than 155 nanometers and spacing between any two neighboring fins is less than 30 nanometers and each fin is in non-collapsed state. An integrated circuit device with a substrate and a plurality of fins is provided where fin width is less than 15 nanometers, fin height is greater than 190 nanometers and spacing between any two neighboring fins is less than 30 nanometers and each fin is in non-collapsed state. A method for forming a fin-based transistor structure is provided where a plurality of fins on a substrate are pre-treated with at least one of a self-assembled monolayer, a non-polar solvent, and a surfactant. One or more of these treatments is to reduce adhesion and/or cohesive forces to prevent occurrence of fin collapse.

20 Claims, 15 Drawing Sheets

(51) Int. Cl.
*H01L 21/02* (2006.01)
*H01L 21/8234* (2006.01)
*H01L 27/02* (2006.01)
*H01L 29/08* (2006.01)
*H01L 29/423* (2006.01)

(52) U.S. Cl.
CPC ...... *H01L 27/0207* (2013.01); *H01L 29/0653* (2013.01); *H01L 29/0673* (2013.01); *H01L 29/0847* (2013.01); *H01L 29/42372* (2013.01)

(58) Field of Classification Search
CPC ............. H01L 29/0673; H01L 29/0847; H01L 29/42372; H01L 29/66795; H01L 29/78; H01L 29/417; H01L 29/66; H01L 29/785; H01L 29/66545; H01L 29/78696; H01L 29/0649; H01L 29/165; H01L 29/7848; H01L 29/1054; H01L 29/66439; H01L 29/7851; H01L 21/823821; H01L 21/845; H01L 27/0924; H01L 27/1211; H01L 21/823807; H01L 2924/0002; H01L 29/161; H01L 29/775; H01L 21/823814; H01L 21/02532; H01L 29/7827; H01L 29/42392; B82Y 10/00
See application file for complete search history.

(56) References Cited

U.S. PATENT DOCUMENTS

| | | | |
|---|---|---|---|
| 9,343,559 | B2 | 5/2016 | Glass et al. |
| 9,385,220 | B2 | 7/2016 | Liou |
| 9,431,305 | B1 | 8/2016 | Anderson et al. |
| 9,524,969 | B1 * | 12/2016 | Balakrishnan ............... H01L 21/823821 |
| 2013/0234215 | A1 | 9/2013 | Okano |
| 2013/0260571 | A1 | 10/2013 | Matsunaga et al. |
| 2014/0027860 | A1 | 1/2014 | Glass et al. |
| 2014/0256155 | A1 | 9/2014 | Ting et al. |
| 2014/0264600 | A1 | 9/2014 | Adam et al. |
| 2014/0308822 | A1 | 10/2014 | O'Hara |
| 2015/0364603 | A1 * | 12/2015 | Cheng ................ H01L 29/0673 257/192 |
| 2016/0013185 | A1 | 1/2016 | Greene |
| 2016/0099160 | A1 | 4/2016 | Sirard et al. |
| 2016/0218012 | A1 | 7/2016 | Shimamoto et al. |
| 2016/0260802 | A1 | 9/2016 | Glass et al. |
| 2016/0322462 | A1 | 11/2016 | Chou et al. |
| 2016/0343623 | A1 | 11/2016 | Fogel et al. |
| 2017/0141199 | A1 | 5/2017 | Demuynck |
| 2018/0033872 | A1 | 2/2018 | Bao et al. |

OTHER PUBLICATIONS

Office Action from Taiwan Patent Application No. 106127970, dated Dec. 4, 2020, 6 pgs.
International Search Report and Written Opinion received for PCT/US2016/054641, dated Jun. 30, 2017. 14 pages.
International Preliminary Report on Patentability received for PCT/US2016/054641. dated Apr. 2, 2019. 10 pages.
Office Action from U.S. Appl. No. 17/032,063, dated Mar. 31, 2022, 26 pgs.
Office Action from Taiwan Patent Application No. 110129657, dated Feb. 16, 2022, 6 pgs.
Notice of Allowance from Taiwan Application No. 110129657, dated Jul. 14, 2022, 3 pgs.
Office Action from U.S. Appl. No. 17/032,063, dated Aug. 23, 2022, 31 pgs.

* cited by examiner

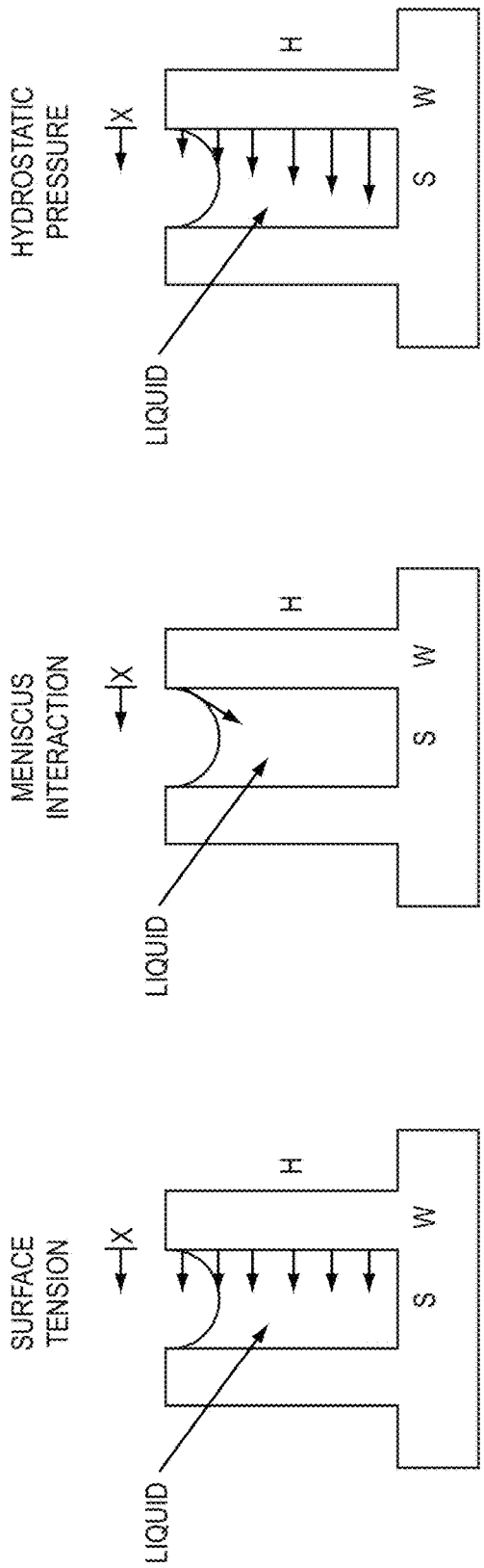

SET 1: W = 11, S = 30, H = 200

INTEGRATED CIRCUIT DEVICES WITH NON-COLLAPSED FINS AND METHODS OF TREATING THE FINS TO PREVENT FIN COLLAPSE

RELATED APPLICATIONS

This application is a continuation of U.S. application Ser. No. 16/327,033 filed Feb. 21, 2019, which is a U.S. National Phase Application under 35 U.S.C. § 371 of International Application No. PCT/US2016/054641 filed Sep. 30, 2016. Each of these applications are incorporated herein by reference in their entirety.

BACKGROUND

A field-effect transistor (FET) is a semiconductor device that generally includes a gate, a source, and a drain. In operation, a FET uses an electric field applied to the gate to control the electrical conductivity of a channel through which charge carriers (e.g., electrons or holes) flow from the source to the drain. A gate dielectric is used to separate the gate from other regions of the FET, including the source and drain as well as the channel that connects source and drain when the transistor is biased to an on or otherwise conductive state (as opposed to an off-state or non-conductive state). FETs can be implemented in both planar and non-planar architectures. For instance, a finFET is a non-planar transistor built around a thin strip of semiconductor material (generally referred to as a fin). A finFET includes the standard FET nodes, including a gate, a gate dielectric, a source, and a drain. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Another type of finFET is the so-called double-gate finFET configuration, in which the conductive channel principally resides only along the two sidewalls of the fin (and not along the top of the fin). Another non-planar transistor configuration is sometimes referred to as a nanowire configuration, which is configured similarly to a fin-based transistor, but instead of a finned channel region, one or more nanowires (or nanoribbons, depending on aspect ratio) are used and the gate material generally surrounds each nanowire. Such nanowire configurations are sometimes called gate-all-around FETs. For any such configurations, and as will be appreciated in light of this disclosure, fin collapse is an issue.

BRIEF DESCRIPTION OF THE DRAWINGS

FIG. 3A-3C are illustrations of surface tension, meniscus interaction, and hydrostatic pressure on the fins.

FIG. 3D illustrates the mathematical equation used to calculate fin deflection based upon surface tension, meniscus interaction and hydrostatic pressure on the fins.

FIGS. 4A-8C are graphical illustrations depicting conditions in which fin collapse occurs with a fin-based transistor device when the fins are not treated with the various treatments discussed herein.

Figure 1A:
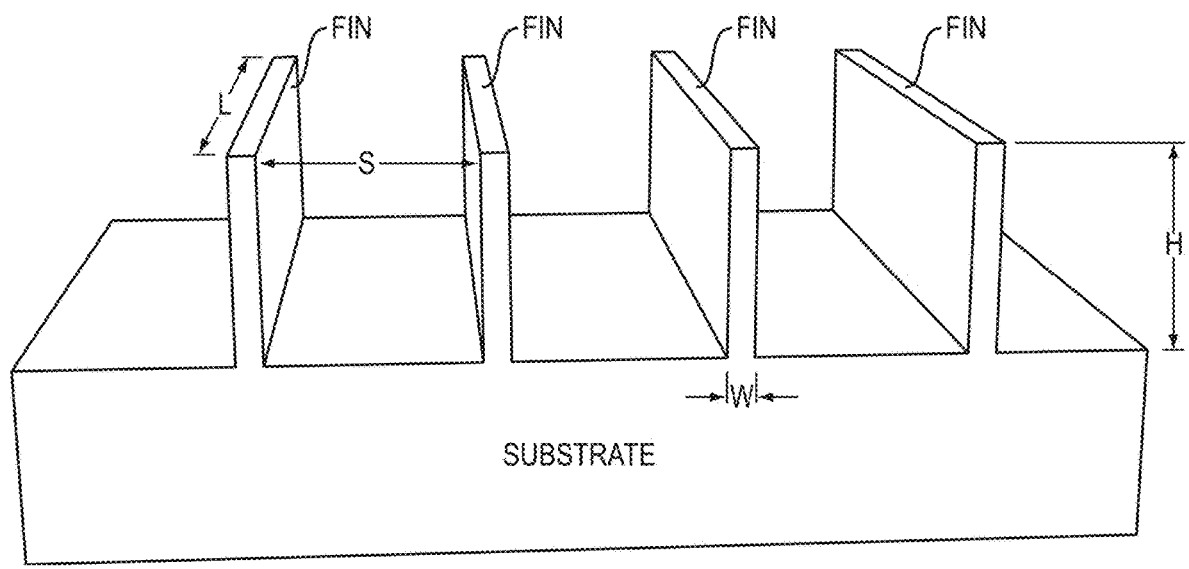
FIGS. 1A-1E illustrate different integrated circuit structures in accordance with various embodiments of the present disclosure, all with fins in a non-collapsed state.

As will be appreciated, the figures are not necessarily drawn to scale or intended to limit the claimed scope to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

The present disclosure is directed to integrated circuit devices and methods for forming integrated circuit devices with fin-based transistor structures, such as finFET and nanowire transistor configurations. An integrated circuit device according to an embodiment includes a substrate with a plurality of fins extending from the substrate. Each fin has a fin height, a fin width, and a fin length, the fin height including an upper channel portion and a lower sub-fin portion. In some such embodiments, the fin width is less than 11 nanometers, the fin height is greater than 155 nanometers, and the spacing between any two neighboring fins of the plurality is less than 30 nanometers. In another embodiment, the fin width is less than 15 nanometers, the fin height is greater than 190 nanometers, and the spacing between any two neighboring fins of the plurality is less than 30 nanometers. Other possible fin geometries will be apparent in light of this disclosure. In any such cases, each of the fins is in a non-collapsed state. This is because the fins are treated to resist collapse prior to transistor forming processing, in accordance with some embodiments. The treatment may include, for example, at least one of a non-polar solvent rinse, a surfactant solution rinse, and a self-assembled monolayer treatment prior to, during or after wet clean processing. Numerous integrated circuit configurations employing the treated fins will be apparent.

General Overview

The present disclosure recognizes that under standard manufacturing techniques, when the fin size and/or fin spacing on a device is reduced, the electrical properties of the fins may be compromised. In particular, when the fins are too narrow in width, when the fins are produced in a tight pitch (i.e., small space between adjacent fins), when the fins are too tall in fin height, and/or when the fins are too short in fin length, subsequent processing can cause a phenomenon referred to herein as fin collapse, where adjacent fins collapse onto each other in response to cohesive forces and/or adhesion forces. Fin collapse is undesirable and typically renders the device inoperable. Thus, aspects of the present disclosure are directed to surface modification or treatment technology to prevent collapse of high aspect ratio nanostructures such as semiconductor fins used to form FETs. As will be appreciated, the techniques provided herein can be used, for example, to modify the surface of high aspect ratio fins to reduce the adhesion forces and/or cohesive forces, thereby eliminating or otherwise reducing fin collapse.

FIGS. 1A-1E illustrate integrated circuit structures having various fin configurations, in accordance with various embodiments of the present disclosure. As shown, in each embodiment, the integrated circuit structure includes a substrate and a plurality of fins extending from the substrate. The details on the formation of the fins and the materials used to construct the integrated circuit devices are discussed in greater detail below, but in general, any desired fin formation processes can be used. In one particular embodiment, the fins are patterned and etched from the substrate, such that the fins are native to the substrate. Alternatively, the fins may be formed using an aspect ratio trapping (ART) process, where sacrificial fins native to the substrate are formed and then removed and replaced with desired fin material(s) such as a continuous fin material or a multilayer stack of different fin materials. The substrate can be, for example, bulk silicon (Si), bulk silicon germanium (SiGe), silicon on insulator (SOI), or germanium on insulator (GOI), or bulk III-V compound such as gallium arsenide (GaAs), to name a few examples. In a more general sense, the substrate can be any suitable platform within which or on which semiconductor fins can be formed. The various fin materials and configurations will be discussed in turn.

Figure 1B:
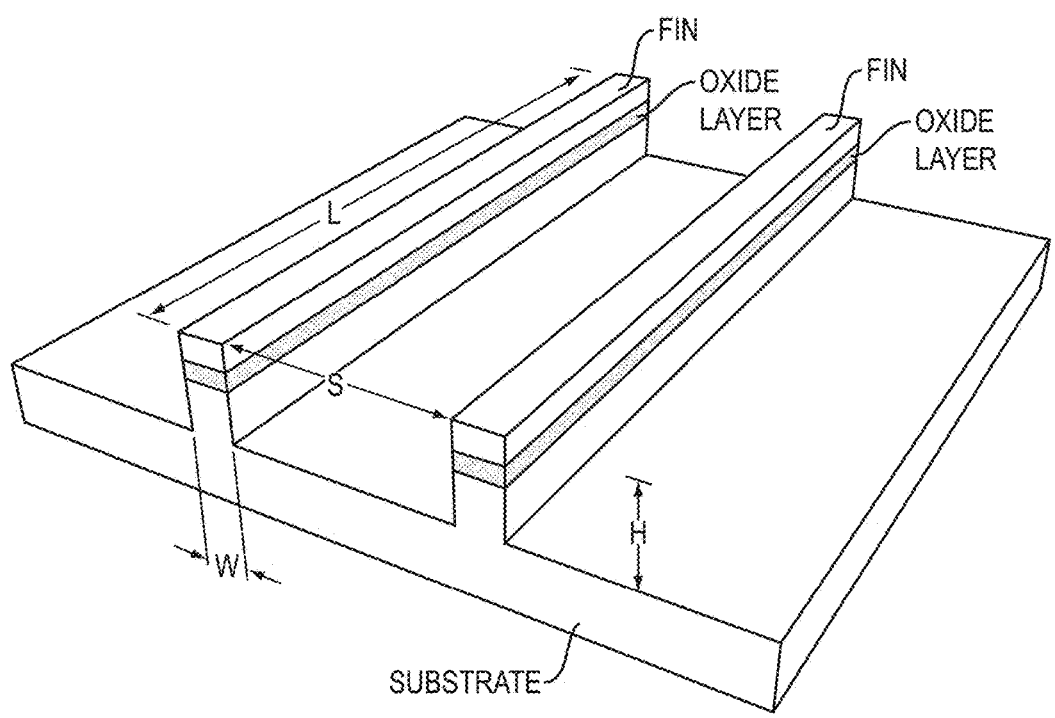

As shown in FIGS. 1A and 1B, each fin has a fin height H, a fin width W, and a fin length L. As shown, the fin length L is longer than the fin width W. As also illustrated in FIGS. 1A and 1B, each device has a fin spacing S which is defined as the distance between facing sidewalls of neighboring fins. FIG. 1A is an example embodiment of fins that are native to the substrate such that they are a continuous extension of the substrate with no seam. FIG. 1B is an example embodiment of fins where at least a portion of the fins are native to the substrate in that the lower portion of each fin is a seamless extension of the substrate. The embodiment illustrated in FIG. 1B also includes an optional oxide layer in the fins that originates from the substrate wafer being SOI. This may have desirable electrical characteristics, such as inhibiting sub-fin leakage. Other embodiments with replacement fins and planar single and multi-layers converted to fins are possible as well as will be apparent. Further details on the formation of the fins and the materials used to construct the integrated circuit devices are discussed in greater detail below.

Figure 1C:
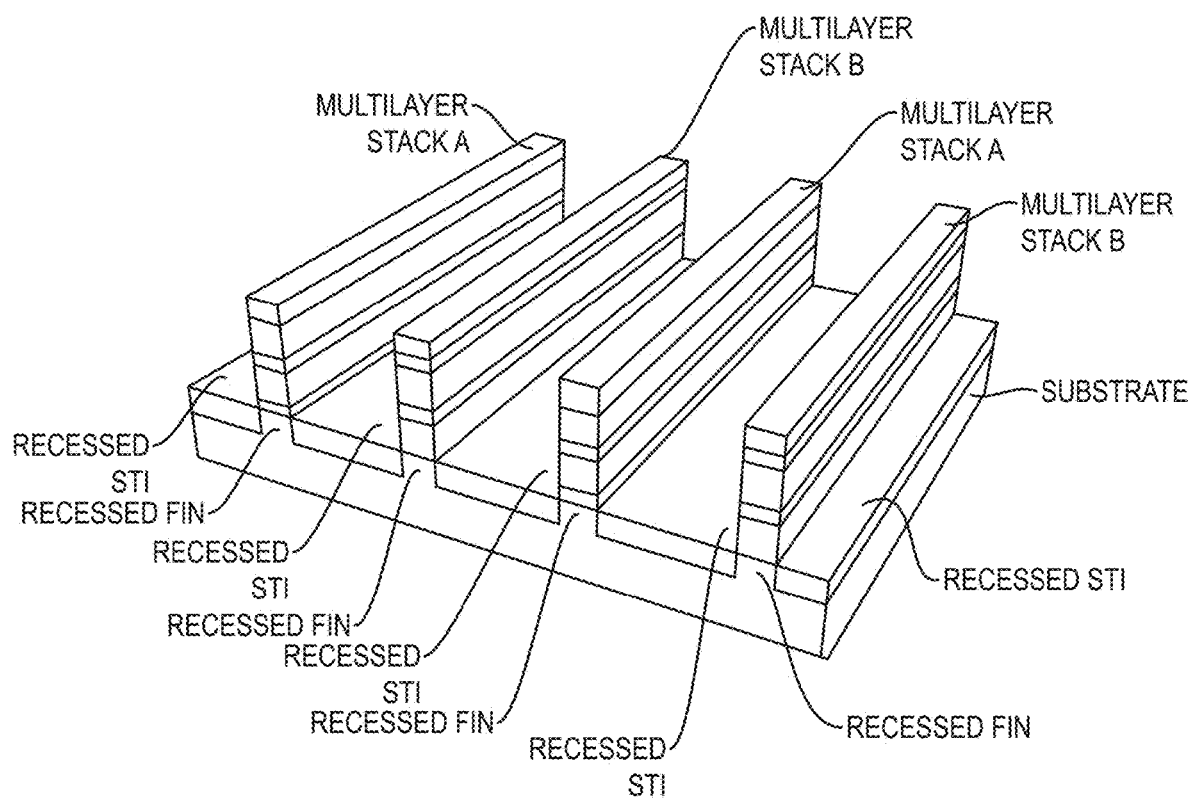

FIG. 1C illustrates an integrated circuit structure which includes nanowires. One example of such structure is discussed in greater detail in U.S. Pat. No. 9,343,559 titled "Nanowire Transistor Devices and Forming Techniques" and assigned to Intel Corporation. FIG. 1C illustrates a structure where the trench oxide (or other shallow trench isolation "STI" material) of the structure is recessed, after the multilayer stacks have been provided by an ART-based process. This can be carried out, for example, by masking the finished multilayer stacks A and B and etching the STI to a suitable depth, or without a mask by using a selective etch scheme. Any suitable etch process (e.g., wet and/or dry) can be used. For instance, in one specific example embodiment, wherein the STI is implemented with silicon dioxide and each of the top layers of the multilayers stacks A and B is implemented with silicon, the STI recess process can be carried out using hydrofluoric acid or other suitable etchant that is selective to the non-STI material. As will be appreciated, a mask that is impervious or otherwise suitably resistant to the STI etchant can be patterned to protect the multilayer stacks A and B, if necessary. The depth of the STI recess can vary from one embodiment to the next, and in this example embodiment is flush with the top of the remaining sacrificial fin material (or pedestal). The depth of the STI recess will depend on factors such as the number of wires and/or ribbons per transistor (or the height of the channel portion of the fin, which is generally the portion above the STI), STI thickness and desired isolation, and/or fin height.

Figure 1D:
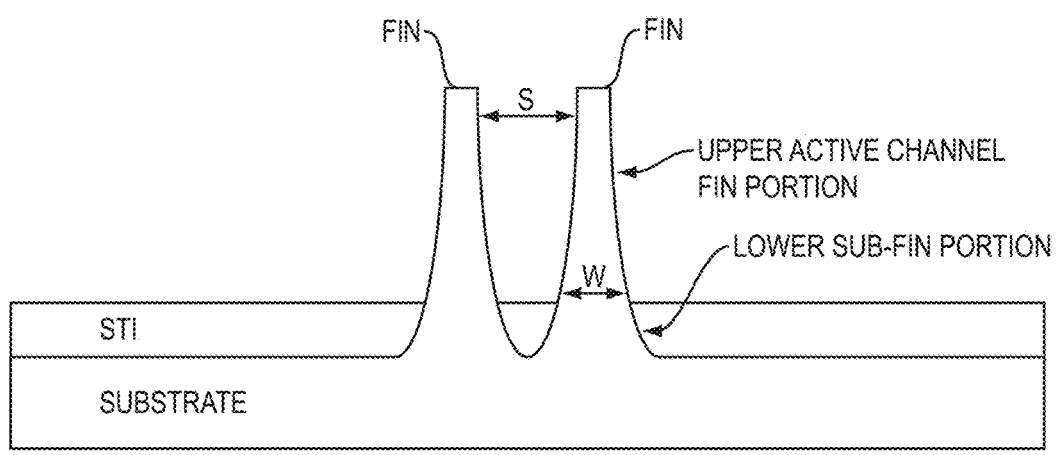
Figure 1E:
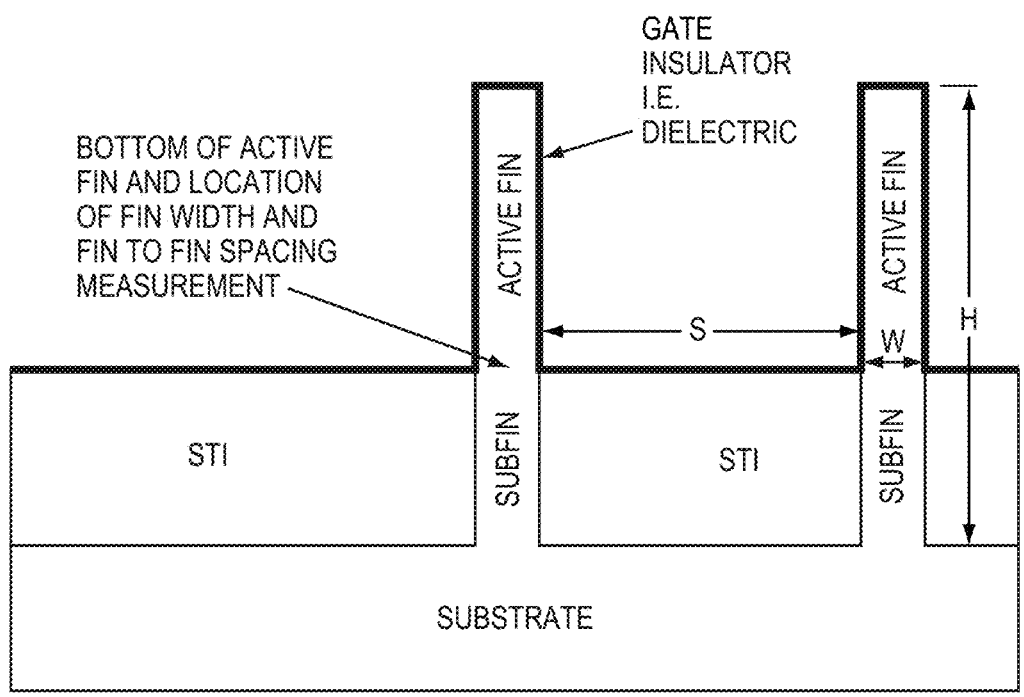

FIG. 1D illustrates an integrated circuit device embodiment which includes fins having a non-uniform width. In this particular embodiment, the fins are tapered in that they are narrower at the top than at the bottom. In addition, in this example configuration, there is an STI (shallow trench isolation) layer deposited on top of the substrate. Each fin includes a lower sub-fin portion and an upper channel portion. The fin height includes the height of the channel portion and the height of the sub-fin portion. The insulation material (such as STI) has a height to just below the lowermost portion of the channel portion of the fins so as to cover the sub-fin portion but not the channel portion. As illustrated, in this embodiment, the fin width W is a distance between laterally opposite sidewall surfaces of the fin at the lowermost portion of the channel portion of the fin. In one embodiment, the spacing S between any two neighboring fins is measured between respective sidewall surfaces of the two neighboring fins at an uppermost portion of the fins. As shown in FIG. 1E discussed below, in another embodiment, the spacing S between any two neighboring fins is measured between respective sidewall surfaces of two neighboring fins at the lowermost portion of the channel portion of the fin.

FIG. 1E illustrates another integrated circuit device embodiment. This is a cross section through the active gate and channel region of a completed transistor. There is an STI (shallow trench isolation) layer deposited on top of the substrate. Each fin includes a lower sub-fin portion and an active fin portion (i.e. upper channel portion). There is a gate insulator on top of the STI layer and around the upper channel portion of the fins. The gate insulator is discussed in more detail below. The structure has gate electrode metal deposited over the fins and gate contacts above that (not shown). The fin height H includes the height of the active fin portion (i.e. channel portion) and the height of the sub-fin portion. The active portion of the fin is defined as the portion that is wrapped by gate insulator. The insulation material (such as STI) has a height to just below the lowermost portion of the channel portion of the fins so as to cover the sub-fin portion but not the channel portion. As illustrated, in this embodiment, the fin width W is a distance between laterally opposite sidewall surfaces of the fin at the lowermost portion of the channel portion of the fin. As also illustrated, in this embodiment, the spacing S between any two neighboring fins is measured between respective sidewall surfaces of two neighboring fins at the lowermost portion of the channel portion of the fin.

Figure 2:
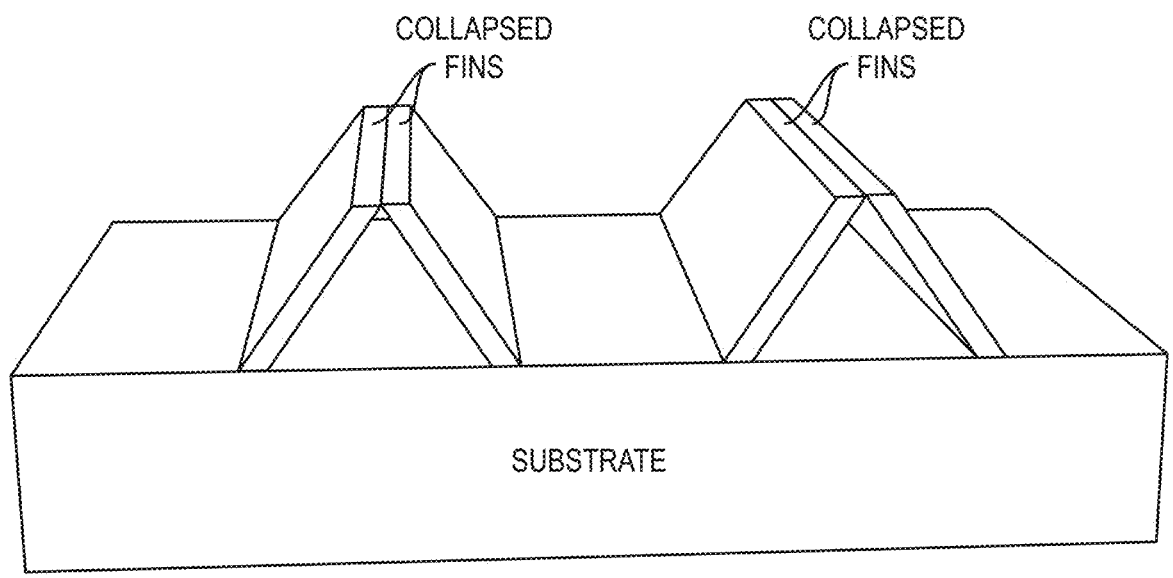
FIG. 2 illustrates an integrated circuit structure with fins that have collapsed.

FIG. 2 illustrates the undesirable occurrence of fin collapse. After the fins are formed, a series of wet processing techniques may occur to prepare the fins for shallow trench isolation (STI). If aqueous based chemistry is used for the wet processing techniques, the fins may bend over in response to the adhesion forces and/or cohesive forces of the neighboring fins. In particular, as shown in FIG. 2, adjacent fins collapse towards one another such that two adjacent fins contact each other. This condition leads to massive device yield loss and is irreversible.

FIG. 3A-3C are illustrations of surface tension, meniscus interaction, and hydrostatic pressure on the fins and FIG. 3D illustrates the mathematical equation used to simulate fin deflection based upon surface tension, meniscus interaction and hydrostatic pressure on the fins. The contact angle of 45° is used in these simulations for aqueous wet-clean chemicals. As shown, fin deflection "x" may be caused by surface tension, meniscus interaction and hydrostatic pressure. If the fin deflection "x" equals ½ of the fin spacing S, then two neighboring fins can be brought into contact with each other, causing fin collapse. By reducing one or more of the surface tension, meniscus interaction and the hydrostatic pressure, one can prevent fin collapse. Hydrostatic pressure is neglible for this embodiment so can be neglected.

FIGS. 4A-8C are graphical illustrations depicting the conditions in which fin collapse occurs with a fin-based transistor device when the fins are manufactured using standard techniques (i.e. when the fins are not treated as discussed hereafter.) As will be appreciated in light of this disclosure, note that fin collapse may be more likely to occur under standard manufacturing techniques when the fin width "W" (distance between laterally opposite sidewall surfaces of the fin at the lowermost portion of the channel portion of the fin) is less than 15 nanometers, the total fin height "H" is greater than 200 nanometers, and the spacing "S" between any two neighboring fins is less than 30 nanometers as measured between respective sidewall surfaces of the two neighboring fins at the lowermost portion of the channel portion (see, for example, FIG. 1E). As will be further appreciated in light of this disclosure, note fin collapse is more prone to occur when the fin length "L" is decreased, fin width "W" is decreased, and fin spacing "S" is decreased due to increasing force levels upon submersion in liquids. A set of five case studies are presented below per the methodology outlined in FIGS. 3A-3D.

Figures 4A, 4B, 4C:
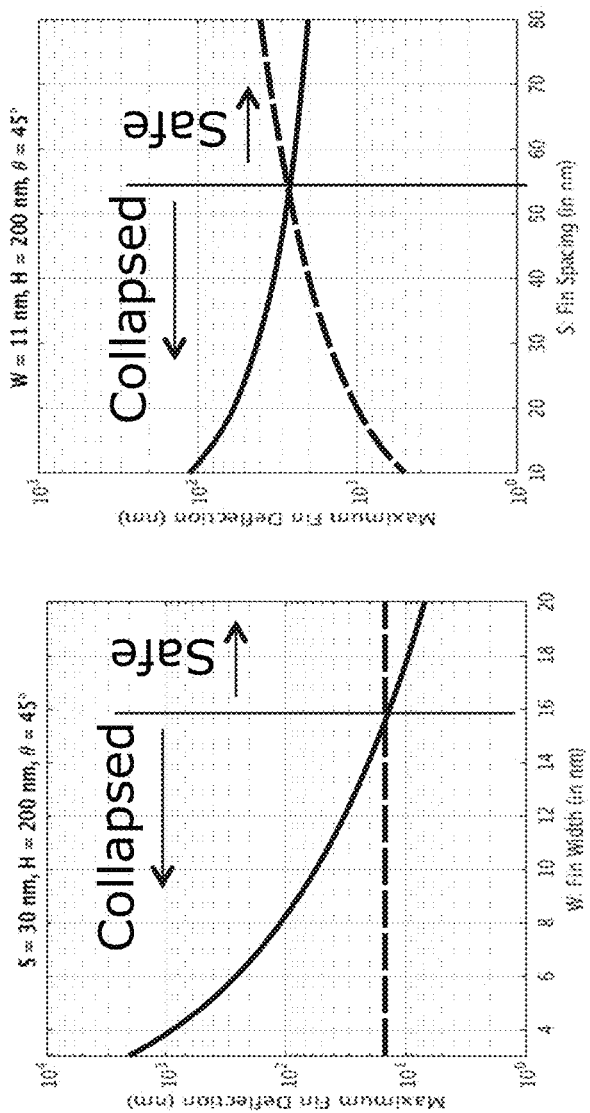

FIG. 4A illustrates when fin collapse will occur under standard manufacturing techniques when the fin spacing S=30 nanometers and the fin height H=200 nanometers. The dashed line indicates the maximum fin deflection that can occur before fin collapse will occur (i.e fins begin to touch) and the solid line represents the fin deflection as a function of the fin width W. As illustrated, under these specific conditions, the fins will collapse if the fin width W is less than 16 nanometers. In contrast, in one embodiment of the present disclosure, an integrated circuit device with a substrate and a plurality of fins is provided where the fin width is less than 15 nanometers, the fin height is greater than 200 nanometers and the spacing between any two neighboring fins is less than 30 nanometers and each of the fins is in a non-collapsed state.

FIG. 4B similarly illustrates when fin collapse will occur under standard manufacturing techniques when the fin width W=11 nanometers and the fin height H=200 nanometers. The dashed line indicates the maximum fin deflection that can occur before fin collapse will occur and the solid line represents the fin deflection as a function of the fin spacing S. As illustrated, under these specific conditions, the fins will collapse if the fin spacing S is less than 55 nanometers. In contrast, in one embodiment of the present disclosure, an integrated circuit device with a substrate and a plurality of fins is provided where the fin width is less than 11 nanometers, the fin height is greater than 200 nanometers and the spacing between any two neighboring fins is less than 53 nanometers and each of the fins is in a non-collapsed state.

FIG. 4C similarly illustrates when fin collapse will occur under standard manufacturing techniques when the fin width W=11 nanometers and the fin spacing S=30 nanometers. The dashed line indicates the maximum fin deflection that can occur before fin collapse will occur and the solid line represents the fin deflection as a function of the fin height H. As illustrated, under these specific conditions, the fins will collapse if the fin height H is greater than 155 nanometers. As set forth in more detail below, the present disclosure is directed to methods of treating the fins to prevent fin collapse such that fin collapse does not occur. For example, in one embodiment of the present disclosure, an integrated circuit device with a substrate and a plurality of fins is provided where the fin width is less than 11 nanometers, the fin height is greater than 155 nanometers and the spacing between any two neighboring fins is less than 30 nanometers and each of the fins is in a non-collapsed state.

Figures 5A, 5B, 5C:
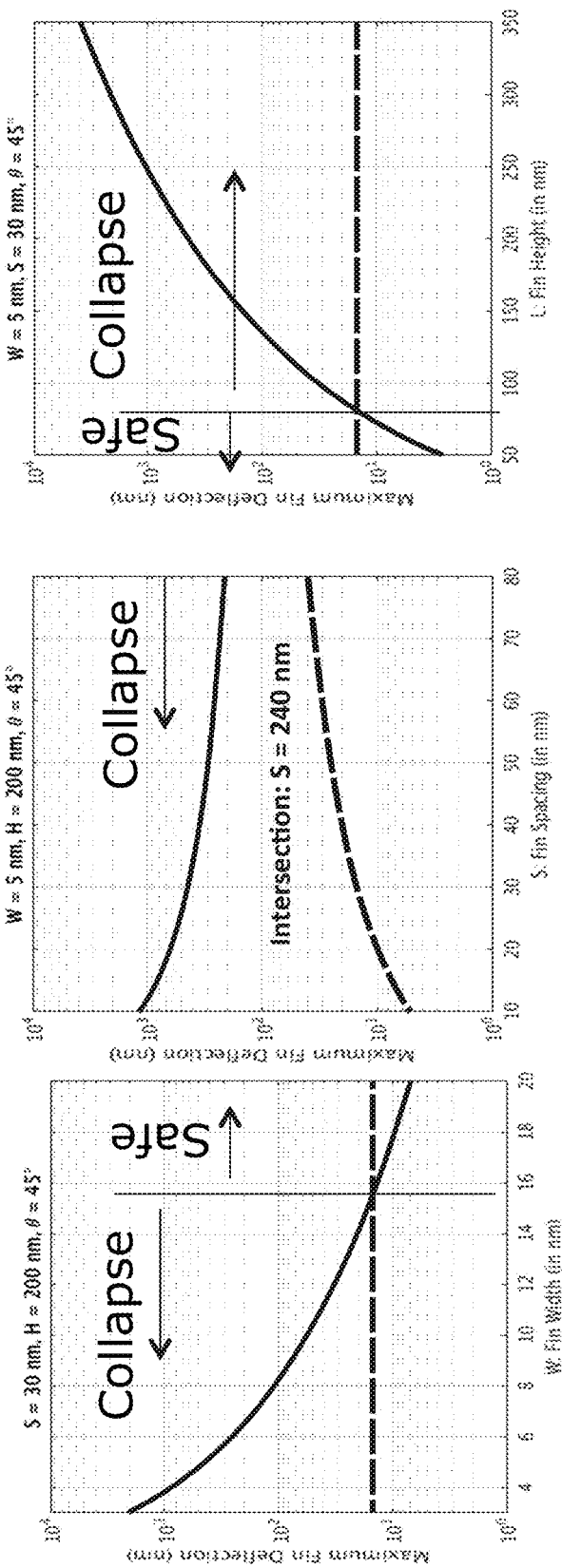

FIG. 5A illustrates when fin collapse will occur under standard manufacturing techniques when the fin spacing S=30 nanometers and the fin height H=200 nanometers. The dashed line indicates the maximum fin deflection that can occur before fin collapse will occur and the solid line represents the fin deflection as a function of the fin width W. As illustrated, under these specific conditions, the fins will collapse if the fin width W is less than 16 nanometers.

FIG. 5B similarly illustrates when fin collapse will occur under standard manufacturing techniques when the fin width W=5 nanometers and the fin height H=200 nanometers. As illustrated, under these specific conditions, the fins will collapse if the fin spacing is less than 240 nanometers. In contrast, in one embodiment of the present disclosure, an integrated circuit device with a substrate and a plurality of fins is provided where the fin width is less than 5 nanometers, the fin height is greater than 200 nanometers and the spacing between any two neighboring fins is less than 240 nanometers and each of the fins is in a non-collapsed state.

FIG. 5C illustrates when fin collapse will occur under standard manufacturing techniques when the fin width W=5 nanometers and the fin spacing S=30 nanometers. As illustrated, under these specific conditions, the fins will collapse if the fin height is greater than 80 nanometers. As set forth in more detail below, the present disclosure is directed to methods of treating the fins to prevent fin collapse such that fin collapse does not occur. For example, in one embodiment of the present disclosure, an integrated circuit device with a substrate and a plurality of fins is provided where the fin width is less than 5 nanometers, the fin height is greater than 80 nanometers and the spacing between any two neighboring fins is less than 30 nanometers and each of the fins is in a non-collapsed state.

Figures 6A, 6B, 6C:
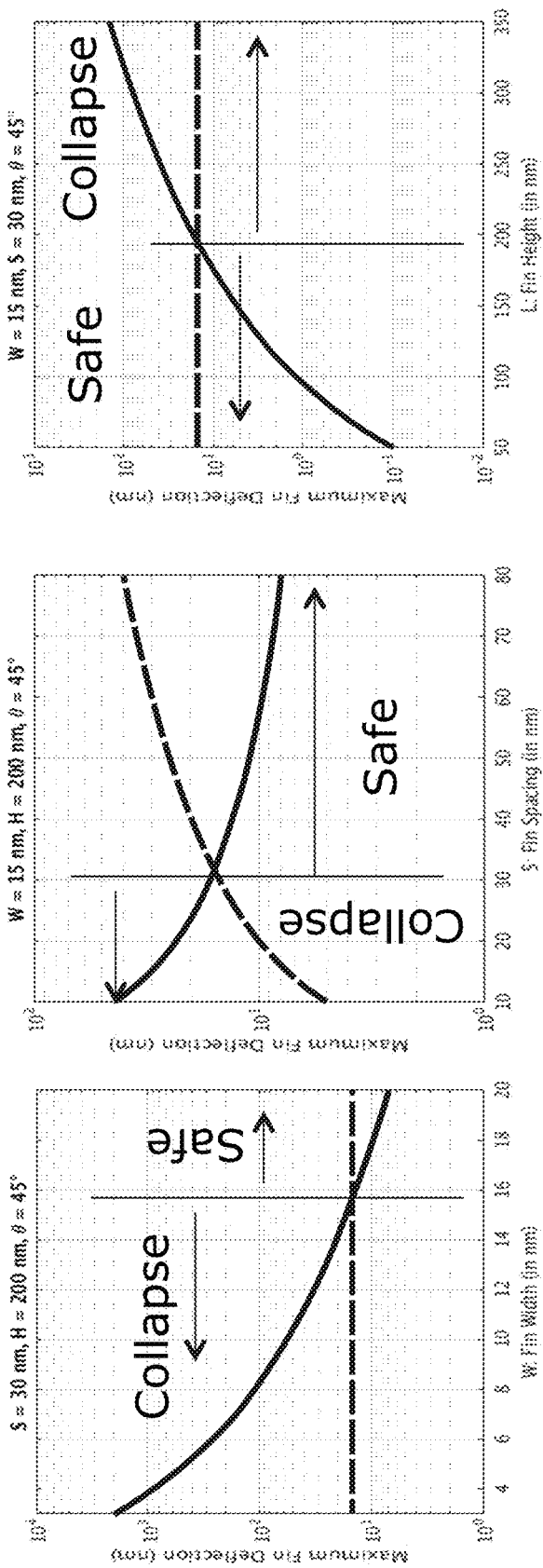

FIG. 6A illustrates when fin collapse will occur under standard manufacturing techniques when the fin spacing S=30 nanometers and the fin height H=200 nanometers, and is identical to FIGS. 4A and 5A discussed above. As illustrated, under these specific conditions, the fins will collapse if the fin width W is less than 16 nanometers.

FIG. 6B illustrates when fin collapse will occur under standard manufacturing techniques when the fin width W=15 nanometers and the fin height H=200 nanometers. As illustrated, under these specific conditions, the fins will collapse if the fin spacing is less than 30 nanometers. In contrast, in one embodiment of the present disclosure, an integrated circuit device with a substrate and a plurality of fins is provided where the fin width is less than 15 nanometers, the fin height is greater than 200 nanometers and the spacing between any two neighboring fins is less than 30 nanometers and each of the fins is in a non-collapsed state.

FIG. 6C similarly illustrates when fin collapse will occur under standard manufacturing techniques when the fin width W=15 nanometers and the fin spacing S=30 nanometers. As illustrated, under these specific conditions, the fins will collapse if the fin height is greater than 200 nanometers. As set forth in more detail below, the present disclosure is directed to methods of treating the fins to prevent fin collapse such that fin collapse does not occur. For example, in one embodiment of the present disclosure, an integrated circuit device with a substrate and a plurality of fins is provided where the fin width is less than 15 nanometers, the fin height is greater than 200 nanometers and the spacing between any two neighboring fins is less than 30 nanometers and each of the fins is in a non-collapsed state.

Figures 7A, 7B, 7C:
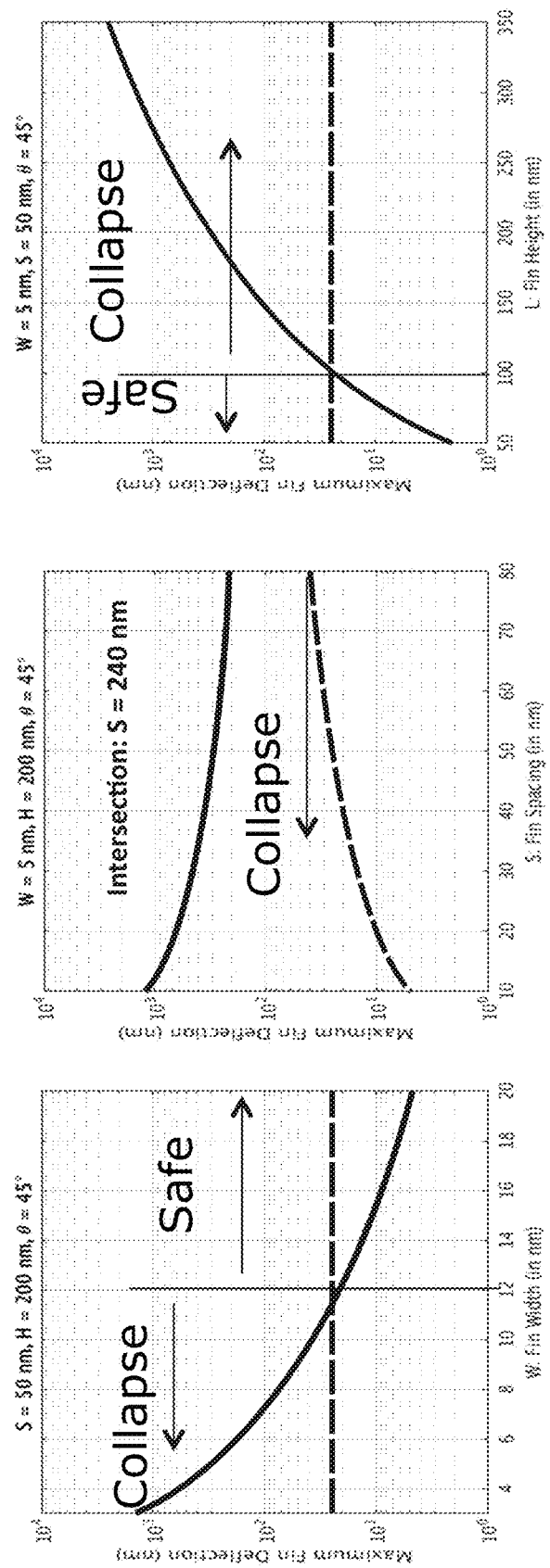

FIG. 7A illustrates when fin collapse will occur under standard manufacturing techniques when the fin spacing S=50 nanometers and the fin height H=200 nanometers. The dashed line indicates the maximum fin deflection that can occur before fin collapse will occur and the solid line represents the fin deflection as a function of the fin width W. As illustrated, under these specific conditions, the fins will collapse if the fin width W is less than 12 nanometers. In contrast, in one embodiment of the present disclosure, an integrated circuit device with a substrate and a plurality of fins is provided where the fin width is less than 12 nanometers, the fin height is greater than 200 nanometers and the spacing between any two neighboring fins is less than 50 nanometers and each of the fins is in a non-collapsed state.

FIG. 7B illustrates when fin collapse will occur under standard manufacturing techniques when the fin width W=5 nanometers and the fin height H=200 nanometers. As illustrated, under these specific conditions, the fins will collapse if the fin spacing S is less than 240 nanometers.

FIG. 7C similarly illustrates when fin collapse will occur under standard manufacturing techniques when the fin width W=5 nanometers and the fin spacing S=50 nanometers. As illustrated, under these specific conditions, the fins will collapse if the fin height H is greater than 100 nanometers. As set forth in more detail below, the present disclosure is directed to methods of treating the fins to prevent fin collapse such that fin collapse does not occur. For example, in one embodiment of the present disclosure, an integrated circuit device with a substrate and a plurality of fins is provided where the fin width is less than 5 nanometers, the fin height is greater than 100 nanometers and the spacing between any two neighboring fins is less than 50 nanometers and each of the fins is in a non-collapsed state.

Figures 8A, 8B, 8C:
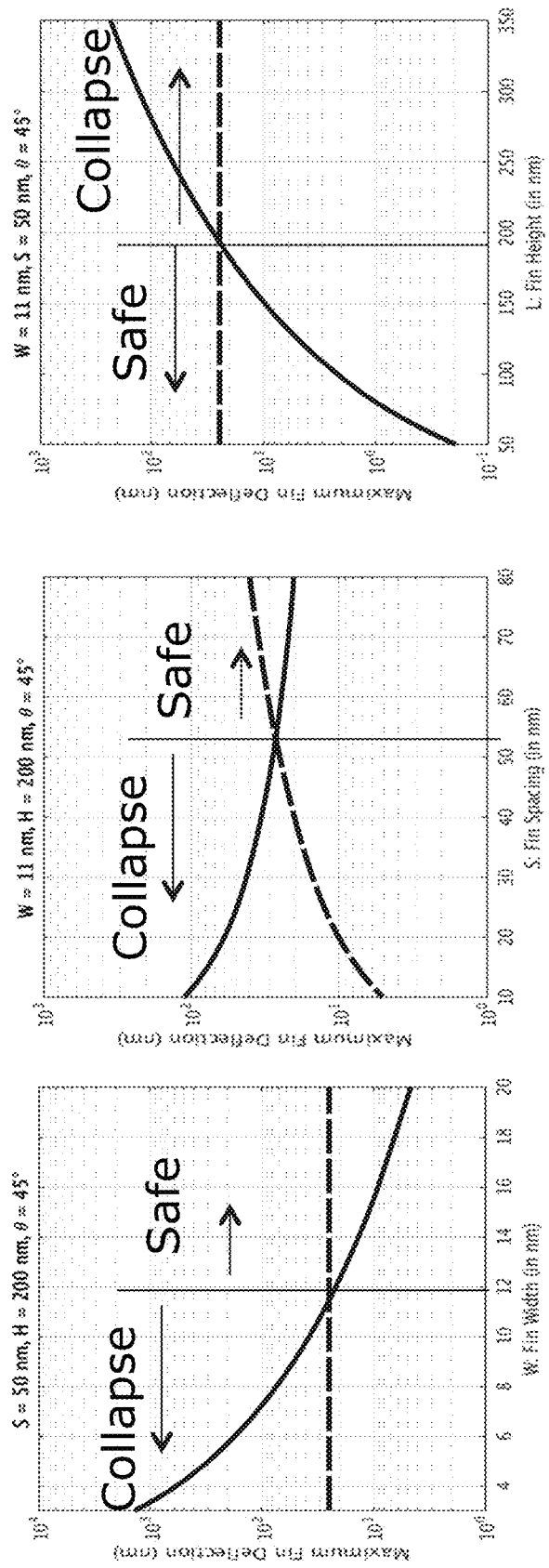

Finally, FIG. 8A illustrates when fin collapse will occur under standard manufacturing techniques when the fin spacing S=50 nanometers and the fin height H=200 nanometers. The dashed line indicates the maximum fin deflection that can occur before fin collapse will occur and the solid line represents the fin deflection as a function of the fin width W. As illustrated, under these specific conditions, the fins will collapse if the fin width W is less than 12 nanometers.

FIG. 8B similarly illustrates when fin collapse will occur under standard manufacturing techniques when the fin width W=11 nanometers and the fin height H=200 nanometers. As illustrated, under these specific conditions, the fins will collapse if the fin spacing S is less than 55 nanometers. In contrast, in one embodiment of the present disclosure, an integrated circuit device with a substrate and a plurality of fins is provided where the fin width is less than 11 nanometers, the fin height is greater than 200 nanometers and the spacing between any two neighboring fins is less than 53 nanometers and each of the fins is in a non-collapsed state.

FIG. 8C similarly illustrates when fin collapse will occur under standard manufacturing techniques when the fin width W=11 nanometers and the fin spacing S=50 nanometers. As illustrated, under these specific conditions, the fins will collapse if the fin height H is greater than 190 nanometers. As set forth in more detail below, the present disclosure is directed to methods of treating the fins to prevent fin collapse such that fin collapse does not occur. For example, in one embodiment of the present disclosure, an integrated circuit device with a substrate and a plurality of fins is provided where the fin width is less than 11 nanometers, the fin height is greater than 190 nanometers and the spacing between any two neighboring fins is less than 50 nanometers and each of the fins is in a non-collapsed state.

As illustrated in FIGS. 1C-1E, and as also set forth in more detail below, in one embodiment, there may be one or more layers on top of the substrate, such as, but not limited to an STI layer. Each fin includes a lower sub-fin portion (which is the portion covered with the STI layer) and an upper channel portion. The channel portion has a height generally referred to herein as the active fin height. In this type of configuration, as will be appreciated in light of this disclosure, fin collapse may occur when the fin width "W" is less than 15 nanometers and the active fin height is greater than 35 nanometers. In one embodiment, the active fin height is between 20 nanometers and 75 nanometers. In another embodiment, the active fin height is between 30 nanometers and 50 nanometers. In yet another embodiment, the active fin height is between 30 nanometers and 40 nanometers. The active fin height is equal to the height of the upper part of the fin having the gate dielectric thereon, and the sub-fin height is equal to the height covered by the initial STI layers on top of the substrate. As will be appreciated, the initial STI can be recessed to expose the channel portion of the fins, so that subsequent MOS processing can be carried out (e.g., including formation of gate, source, and drain regions, and the associated contact structures). As shown in FIGS. 1D and 1E, the total fin height=active fin height+sub-fin height. In one embodiment, the height of the sub-fin portion (which is sometimes referred to as a pedestal) is between 150 nanometers and 300 nanometers. In another embodiment, the height of the sub-fin portion is between about 150 nanometers and 250 nanometers. In another embodiment, the height of the sub-fin portion is between about 150 nanometers and 200 nanometers. In yet another embodiment, the height of the sub-fin portion is between about 200 nanometers and 250 nanometers. In yet another embodiment, the height of the sub-fin portion is between about 200 nanometers and 300 nanometers. Numerous such sub-fin/active fin configurations can be used.

Various fin and substrate materials are discussed in greater detail below, but in an embodiment where the fins include a hardmask of either a single layer or multiple composition layers, such as but not limited to silicon nitride (SiN), polycrystalline silicon, and silicon dioxide (SiO2), the problems associated with adhesion forces and/or cohesive forces may be exacerbated, thus leading to fin collapse under standard manufacturing techniques.

Figure 9A:
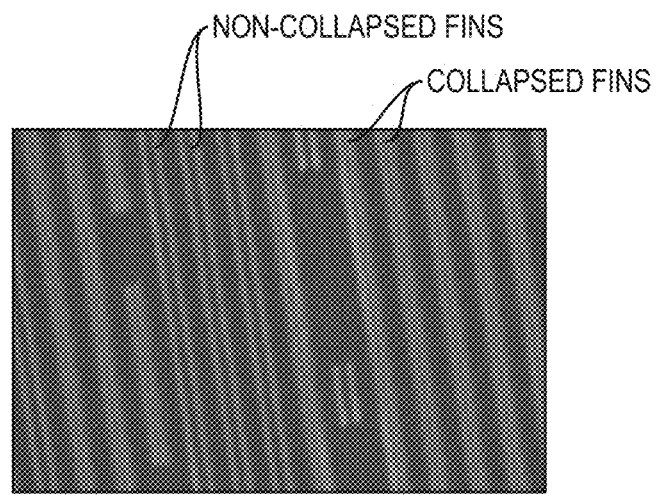
FIG. 9A illustrates a SEM image of an integrated circuit structure with some fin collapse.

FIG. 9A illustrates a Scanning Electron Microscopy (SEM) image of a fin-based integrated circuit structure with some fins shown in a collapsed state. As shown, the collapsed fins may appear as single lines where the uppermost portion of neighboring fins are contacting each other, while the non-collapsed fins may appear as spaced apart double lines. The SEM image shown in FIG. 9A illustrates a mixture of some collapsed fins and some non-collapsed fins. FIG. 9A is representative of a SEM image of a device produced under standard manufacturing techniques. FIG. 9A illustrates a SEM image of an integrated circuit structure having a plurality of fins where the fin width is 11 nanometers, the fin height is 200 nanometers and the spacing between any two neighboring fins is 30 nanometers and each of the fins is in a non-collapsed state. As illustrated in the graphs reproduced in FIGS. 4A, 4B, and 4C a device produced under standard manufacturing techniques with these dimensions will have some collapsed fins.

Figure 9B:
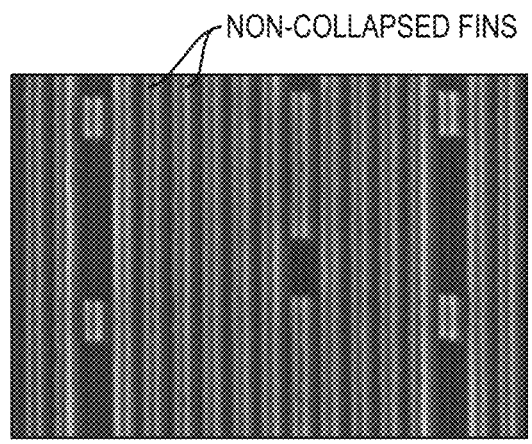
FIG. 9B illustrates a SEM image of an integrated circuit structure according to one embodiment of the present disclosure where each of the fins is in a non-collapsed state.

FIG. 9B illustrates a SEM image of a fin-based integrated circuit structure according to one embodiment of the present disclosure where there is no fin collapse. As shown, all of the fins are in a non-collapsed state, and thus they all appear as double lines in the SEM image where a space remains between neighboring fins. As mentioned above, and as set forth in further detail below, the present disclosure recognizes that the use of a post-pattern treatment on the fins may reduce the adhesion forces and/or cohesive forces, and thus eliminate or otherwise reduce the occurrence of fin collapse. FIG. 9B illustrates a SEM image of an integrated circuit structure having a plurality of fins with dimensions identical to the structure depicted in FIG. 9A (i.e. fin with is 11 nanometers, fin height is 200 nanometers and fin spacing is 30 nanometers). However, unlike the structure shown in FIG. 9A, the structure in FIG. 9B was produced with one or more of the post-pattern treatments described in the present disclosure. Accordingly, the adhesion forces and/or cohesive forces are reduced thereby preventing the occurrence of fin collapse.

Post Fin Formation Treatment

As mentioned above, aspects of the present disclosure are directed to methods of treating the fins to prevent fin collapse. As will be appreciated in light of this disclosure, a standard post-pattern (i.e. STR etch) rinse containing polar liquids, such as aqueous solutions (like sulfuric acid and/or hydrofluoric acid rinses), may cause or otherwise contribute to fin collapse.

Accordingly, the present disclosure provides alternatives to standard post-pattern rinse technology. To this end, a plurality of different post fin formation treatments is provided herein which may be used alone, or in combination, to reduce the adhesion and/or cohesive forces between adjacent fins, to thus eliminate fin collapse.

In one embodiment of the present disclosure, a post-pattern treatment including a non-polar solvent is used. In one such embodiment, once the fins are formed (sometimes generally referred to herein as being patterned), a treatment with a non-polar solvent may help to reduce the occurrence of subsequent fin collapse. For example, after the fins are formed on the substrate, the fins may be treated with a non-polar solvent such as, but not limited to, isopropyl alcohol (IPA), ethanol and/or hexane. In one embodiment, the non-polar solvent may be sprayed onto the fins on the substrate. In another embodiment, the fins on the substrate may be cleaned in a wet processing tool plumbed with the non-polar solvent. In a more general sense, the non-polar solvent may be applied using any suitable techniques. As will be further appreciated, numerous non-polar solvents may also be used as a post-pattern treatment on the fins to reduce adhesion and/or cohesive forces and thus reduce the occurrence of fin collapse.

In another embodiment of the present disclosure, a post-pattern treatment including a surfactant may be used to derivatize the surface of the fins. A treatment with a surfactant may help to reduce adhesion and/or cohesive forces between the fins and thus reduce the occurrence of fin collapse. For example, after the fins are formed on the substrate, the fins may be treated with a surfactant such as, but not limited to, soaps, detergents, or ammonia based solutions. In one embodiment, the surfactant may be sprayed onto the fins on the substrate. In another embodiment, the fins on the substrate may be submerged into a wet bench containing a solution including the surfactant in an appropriate solvent (aqueous or non-polar as described above). In a more general sense, the surfactant may be applied using any suitable techniques. As will be further appreciated, numerous other surfactants may also be used as a post-pattern treatment on the fins to reduce the occurrence of fin collapse.

In yet another embodiment of the present disclosure, a post-pattern treatment may include a self-assembled monolayer. For example, after the fins are formed on the substrate, the fins may be treated with a self-assembled monolayer, such as, but not limited to, an amine or fluoride containing self-assembled monolayer, sometimes referred to as a Langmuir-Blodgett monolayer. Such a monolayer may be used to pre-treat the surface to reduce the cohesive and/or adhesion forces that cause fin collapse. In one embodiment, the self-assembled monolayer may be sprayed onto the fins on the substrate. In another embodiment, the fins on the substrate may be processed in a wet bench containing a solution including the self-assembled monolayer. In a more general sense, the self-assembled monolayer may be applied using any suitable techniques. As will be further appreciated, numerous other self-assembled monolayers may also be used as a post-pattern treatment on the fins to reduce the occurrence of fin collapse.

Figure 10:
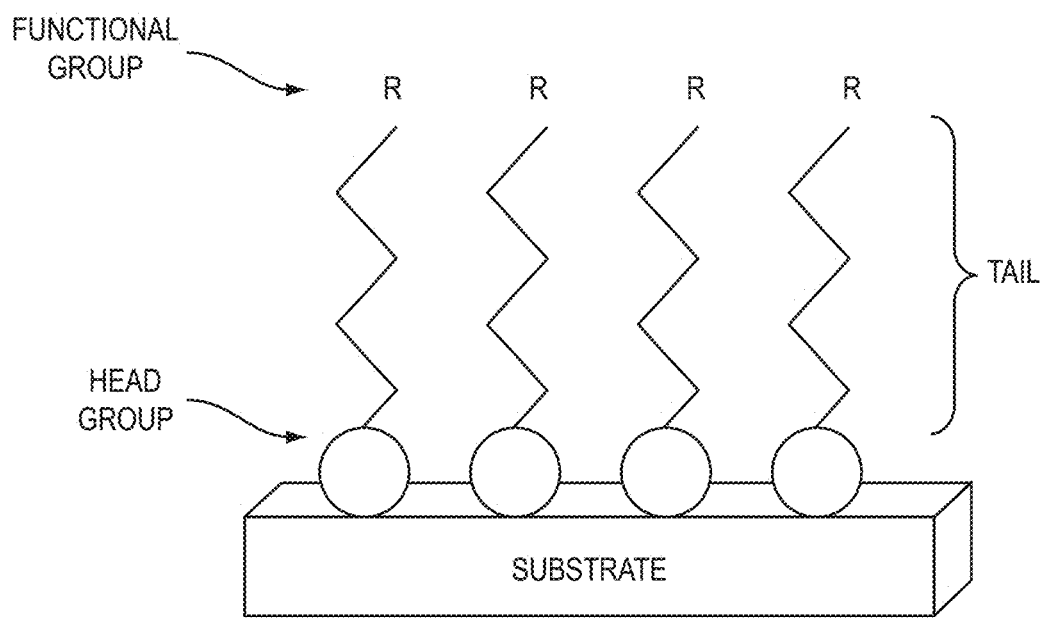
FIG. 10 is a schematic illustration of a self-assembled monolayer used in a method of forming an integrated circuit device in accordance with one embodiment of the present disclosure.

Turning to FIG. 10, a schematic diagram of a self-assembled monolayer which may be used in a post-pattern treatment according to one embodiment of the present disclosure is illustrated. As illustrated, in one embodiment, the self-assembled monolayer includes a head group, a tail, and a functional group. The head group may include a compound configured to adhere to the fins when the fins are treated with the self-assembled monolayer, and the functional group may include a compound that is configured not to adhere to the fins, thus reducing the occurrence of fin collapse.

Table 1, reproduced below, illustrates example compositions for the head group, tail, and functional group of the self-assembled monolayer based upon example fin materials. For example, in one embodiment, when the integrated circuit device includes fins made of group IV semiconductor materials such as silicon, silicon germanium (SiGe), or germanium (Ge), the head group of a self-assembled monolayer may be made of silane, ammonia, and/or germane, the tail may be made from butane, propane and/or carbon, and the functional group may be made of glycerol, hydroxide, and/or fluorine/fluoride. As shown, in another example embodiment, when the integrated circuit device includes fins made of semiconductor materials classified as group III-V, such as, but not limited to, gallium arsenide (GaAs), indium gallium arsenide (InGaAs), or indium phosphide (InP), the head group of a self-assembled monolayer may be made from methyl gallium, methyl aluminum, and/or ammonia, the tail may be made from butane, propane and/or carbon, and the functional group may be made of glycerol, hydroxide, and/or fluorine/fluoride. As will be appreciated, these are example compositions of the self-assembled monolayer and that, in another embodiment, the self-assembled monolayer may include other compositions as the present disclosure is not intended to be limited in this respect.

TABLE 1

Self-Assembled Monolayer Compositions

| Fin material | Head | Tail | Functional group |
|---|---|---|---|
| Silicon or SiGe or Ge | silane ammonia germane | butane propane up to 10 carbon chains | glycerol hydroxide fluorine/fluoride |
| III-V i.e. GaAs, InGaAs, InP | methyl gallium methyl aluminum ammonia | butane propane up to 10 carbon chains | glycerol hydroxide fluorine/fluoride |

As mentioned above, these post-pattern treatments may be used alone, or in combination, to reduce the adhesion and/or cohesive forces, to thus eliminate fin collapse. In one embodiment all three of the above-mentioned post-pattern treatments may be used during the manufacturing process to enable one to make smaller-scale integrated circuit devices with fin patterns that would, without such a post-pattern treatment, have fins in a collapsed state. In other embodiments, any two of the three treatment types are used on the fins. In one particular embodiment, the fins on the substrate are treated first with a non-polar solvent, second with a surfactant, and third with a self-assembled monolayer. In another embodiment, the post-pattern treatment includes a non-polar solvent and a self-assembled monolayer. In another embodiment, the post-pattern treatment includes a surfactant and a self-assembled monolayer. In yet another embodiment, the post-pattern treatment includes a non-polar solvent and a surfactant. All possible permutations can be used.

Aspects of the present disclosure are directed to a method for forming a fin-based transistor structure. The method includes forming a plurality of fins on a substrate, each fin extending from the substrate, and treating the plurality of fins on the substrate with at least one of: a self-assembled monolayer; a non-polar solvent; and a surfactant. The method may further include depositing insulation material on opposing sides of each fin and up to a certain height on the fins (or recessing excess insulation material), so as to leave a top portion of the fins exposed, and forming a gate stack over a channel region of at least one of the fins, forming source and drain regions adjacent the channel region, and forming source and drain contacts on the source and drain regions, respectively.

As mentioned above, the treating of the fins on the substrate may include, for example, applying the self-assembled monolayer onto the plurality of fins on the substrate and/or submerging the plurality of fins on the substrate in a wet bench containing a solution including the self-assembled monolayer. Treating the plurality of fins on the substrate may include treating with the self-assembled monolayer, and the self-assembled monolayer comprises a head group, a tail, and a functional group, wherein the head group includes silane, ammonia and/or germane, the tail group includes butane, propane and/or hydro-carbon chains with 4 to 100 carbon atoms, and the functional group includes glycerol, hydroxide, and/or fluorine/fluoride. In another embodiment, the method includes treating with the self-assembled monolayer, and the self-assembled monolayer comprises a head group, a tail and a functional group, wherein the head group includes methyl gallium, methyl aluminum, and/or ammonia, the tail group includes butane, propane and/or carbon, and the functional group includes glycerol, hydroxide, and/or fluorine/fluoride. In another embodiment, the method includes treating the with the self-assembled monolayer, and the self-assembled monolayer comprises a head group, a tail and a functional group, wherein the tail group includes butane, propane and/or carbon, and the functional group includes glycerol, hydroxide, and/or fluorine/fluoride.

As mentioned above, the treating of the fins on the substrate may include spraying the non-polar solvent onto the plurality of fins on the substrate and/or submerging the plurality of fins on the substrate into a dip tank filled with the non-polar solvent, where the non-polar solvent is at least one of isopropyl alcohol, ethanol and hexane.

In another embodiment, the method includes the treating of the fins on the substrate with a surfactant and the surfactant is an ammonia-based solution which may include spraying the surfactant onto the plurality of fins on the substrate and/or submerging the plurality of fins on the substrate into a dip tank filled with the surfactant.

Transistor Device Materials and Construction

The fins may be formed on or from the substrate by a variety of conventional approaches as the disclosure is not limited in this respect. In one embodiment, the substrate may be formed from a bulk silicon substrate and the shallow trench recess (STR) may be etched out of the silicon by standard etch techniques. In one embodiment, the plurality of fins is native to the substrate in that each fin is a seamless extension of the substrate. In another embodiment, the plurality of fins are replacement fins formed on the substrate in that there is a seam located at an intermediate height of the fin and the replacement fins may be formed by standard techniques, such as those described in U.S. Patent Application Publication 2014/0027860 titled "Self-Aligned 3-D Epitaxial Structures for MOS Device Fabrication" and assigned to Intel Corporation. Such fins can be formed using an aspect ratio trapping or so-called ART-based process as previously explained and will be further discussed in turn.

In one embodiment, there is a first plurality of fins and a second plurality of fins, each extending from the substrate. Each of the first and second plurality of fins may be replacement fins in that there is a seam where each of the fins interfaces with the substrate. In another embodiment, each of the first and second plurality of fins is native to the substrate in that each fin is a seamless extension of the substrate. In yet another embodiment, each of the first plurality of fins is native to the substrate in that each fin is a seamless extension of the substrate, and each of the second plurality of fins is a replacement fin in that there is a seam where each such fin interfaces with the substrate. In yet another embodiment, at least some of the replacement fins are configured with multilayer stacks of alternating material suitable for nanowire configurations.

Any number of suitable substrate configurations can be used here, including bulk substrates, semiconductors on insulator substrates (XOI, where X is a semiconductor material such as Si, Ge or Ge-enriched Si), and multi-layered structures. In one specific example case, the substrate is a silicon bulk substrate. In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Further semiconductor materials classified as group III-V materials, such as, but not limited to, gallium arsenide (GaAs), indium gallium arsenide (InGaAs), or indium phosphide (InP), may also be used to form the substrate. Although a few examples of materials from which the substrate may be formed are described here, any material that may serve as a foundation upon which a semiconductor device may be built falls within the spirit and scope of the disclosure.

The fins can be formed using any number of suitable processes, as previously explained. Some embodiments may employ, for example, the deposition and patterning of a hardmask on the substrate. This can be carried out using standard photolithography, including deposition of or more hardmask materials (e.g., such as silicon dioxide, silicon nitride, and/or other suitable hardmask materials), patterning resist on a portion of the hardmask that will remain temporarily to protect an underlying region of the fin (such as a channel or active area of a transistor device), etching to remove the unmasked (no resist) portions of the hardmask (e.g., using a dry etch, or other suitable hardmask removal process), and then stripping the patterned resist material, thereby leaving the patterned mask. In some such embodiments, the resulting hardmask is a two-layer hardmask configured with a bottom layer of oxide (e.g., native oxide, such as silicon dioxide resulting from oxidation of silicon substrate) and top layer of silicon nitride. Any number of suitable mask configurations can be used in forming the fins, as will be apparent.

As can be further seen in FIGS. 11A, 11B, 12A, 12B, and 12C discussed below, shallow trenches may be provisioned in the substrate and subsequently filled with an insulating material so as to provide shallow trench isolation (STI) about a plurality of fins, in accordance with an embodiment of the present disclosure. Any number of fins can be provided, and in any number of patterns or configurations suitable for a given application. The techniques provided herein are particularly well-suited to tall, narrow and densely spaced fins, as previously explained. The shallow trench etch can be accomplished, for example, with EUV photolithography including wet or dry etching, or a combination of etches if so desired or by spacer fin patterning using conventional 193 nm lithography. The geometry of the trenches (width, depth, shape, etc.) can vary from one embodiment to the next as will be appreciated, and the disclosure is not intended to be limited to any particular trench geometry. Any number of trench configurations can be used depending on the desired fin height, as will be apparent. The trenches can be subsequently filled using any number of suitable deposition processes. In one specific example embodiment having a silicon substrate, the insulating STI fill material is $SiO_2$, but any number of suitable isolation dielectric materials can be used to form the shallow trench isolation (STI) structures here. In general, the deposited or otherwise grown isolation dielectric material for filling the trenches can be selected, for example, based on compatibility with the native oxide of the substrate material.

While the embodiments shown in FIGS. 1A-1C show fins as having a width that does not vary with distance from the substrate, as shown in FIG. 1D, the fin may be narrower at the top than the bottom in another embodiment, or the fins may be wider at the top than the bottom in another embodiment, or having any other width variations and degrees of uniformity (or non-uniformity). Further note that the width variation may, in some embodiments, be symmetrical or asymmetrical. Also, while the fins are illustrated as all having the same width, some fins may be wider and/or otherwise shaped differently than other fins on the same substrate.

In one embodiment, the fins can be formed using an aspect ratio trapping (ART) methodology, such as that described in the previously noted U.S. Patent Application Publication 2014/0027860. In such cases, the channel material can be provided after so-called placeholder fins are formed and then recessed or otherwise removed. In more detail, the substrate can be patterned and etched into placeholder fins formed from the substrate material. Those fins are then encased in an insulator or other suitable material. The place holder fins can then selectively be recessed or otherwise removed and replaced with a desired channel material. In some such cases, the replacement channel material can be provided in the context of multilayer stacks that include alternating layers of desired channel material and sacrificial/inactive material, such as that described in the previously noted U.S. Pat. No. 9,343,559.

Subsequent processing to form a completed transistor device, which may include for instance, source and drain regions, a final gate stack, and metal contacts, can be carried out for instance as normally done or using any custom processing as desired. Numerous configurations will be apparent in light of this disclosure, and the present disclosure is not intended to be limited to any particular one. In addition, some example source/drain forming techniques and structures, in accordance with various embodiments, are provided in turn with further reference to FIGS. 11A, 11B, 12A, 12B, and 12C, discussed below.

Following formation of the discrete channel regions such as in the variously example embodiments depicted in FIGS. 1A-1D, gate dielectric and gate electrode processing may be performed, and source and drain contacts may be added, in accordance with some example embodiments. Such post-channel processing can be carried out, for instance, as normally done. Note that gate formation may be carried out using a gate-last or so-called RMG (remove metal gate) process, where dummy gate materials are first provided over the channel and then later removed and replaced with the desired gate materials after the source/drain processing is complete. Alternatively, the gate formation may be carried out using a gate-first process.

In some example embodiments, the gate dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. The gate electrode material can be, for example, polysilicon, silicon nitride, silicon carbide, or a metal layer (e.g., tungsten, titanium nitride, tantalum, tantalum nitride) although other suitable gate electrode materials can be used as well. The formed gate electrode may then be covered with a mask to protect it during subsequent processing. The gate dielectric, gate electrode and any optional mask materials can be generally referred to as a gate stack or gate structure.

Once the gate stack is fabricated (whether the actual gate or a dummy gate, depending on the gate forming process used), the source/drain regions can be processed. This processing may include, for example, exposing the source/drain regions by etching or otherwise removing the additional insulator material from around the fin or replacement fins, so that source drain regions can be doped (ion implantation) or etched-and-replaced with a desired material(s) and structure.

Then, source/drain contacts can be provisioned, which may be accomplished using a silicide or germanide process, for example. Typical source/drain region materials include silicon, germanium, SiGe, or III-V materials, and are normally doped either n-type (e.g., phosphorous dopant) or p-type (e.g., boron dopant) to provide NMOS or PMOS transistors, respectively. Typical source drain contact materials include, for example, tungsten, titanium, silver, gold, aluminum, and alloys thereof.

As will be appreciated, the depicted methodology can be carried out using any suitable standard semiconductor processes, including lithography, chemical vapor deposition (CVD), atomic layer deposition (ALD), spin-on deposition (SOD), physical vapor deposition (PVD), wet and dry etching (e.g., isotropic and/or anisotropic), depending on the materials used and desired profiles. Alternate deposition techniques may be used as well, for instance, various material layers may be thermally grown. As will be further appreciated in light of this disclosure, any number of suitable materials, layer geometries, and formation processes can be implemented, so as to provide a custom fin-based device or structure as described herein.

FIGS. 1B and 1C each illustrates an embodiment where the fins include multiple layers. As can be seen, each fin may include a channel portion that includes one or more nanowires, each nanowire formed from a corresponding one of the one or more semiconductor layers. As can be further seen, the multi-layer fins may include one or more insulator layers between the one or more semiconductor layers.

Figure 11A:
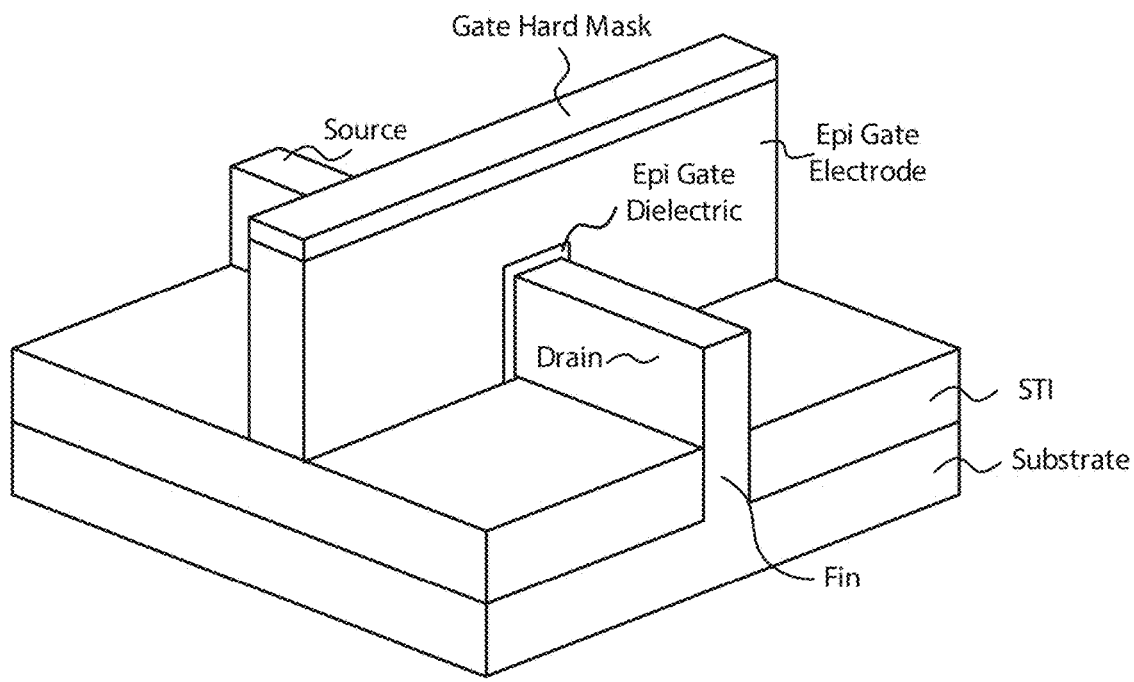
FIGS. 11A and 11B each illustrates a perspective view of an integrated circuit device that is configured in accordance with one embodiment of the present disclosure.
Figure 11B:
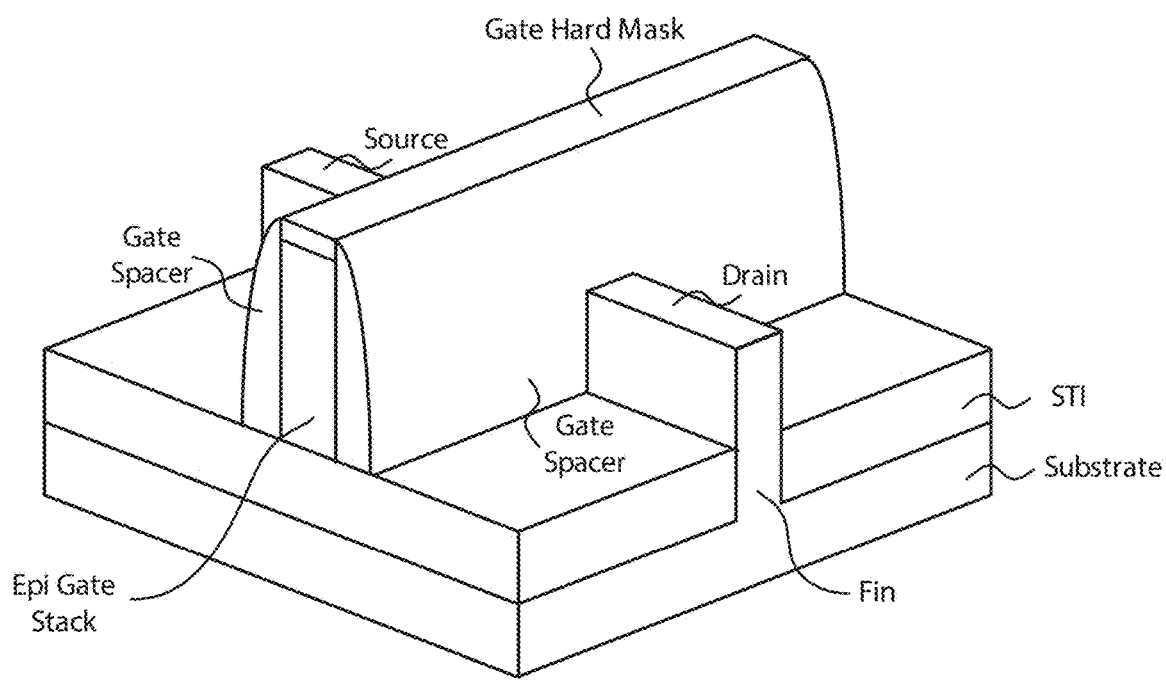

FIGS. 11A and 11B each illustrates a perspective view of an integrated circuit structure that is configured in accordance with one embodiment of the present disclosure. The example non-planar configuration shown in FIG. 11A includes a substrate having a semiconductor body or fin extending from the substrate through a shallow trench isolation (STI) layer. The portion of the fin above the STI layer effectively forms the channel of the transistor device. Recall that the channel portion of the fin may be native to the substrate or an alternative channel material. As can be further seen in FIG. 11A, a gate dielectric material is provided between the fin and a gate electrode, and a hard mask is formed on top of the gate electrode. Note that the gate electrode is formed over three surfaces of the fin to form three gates (hence, a tri-gate device). FIG. 11B illustrates the resulting structure after deposition of insulating material and subsequent etch that leaves a coating of the insulator material on the vertical surfaces of the gate stack (which includes the gate dielectric, gate electrode, and gate hard mask, in this example case), so as to provide the gate spacers.

Figure 12A:
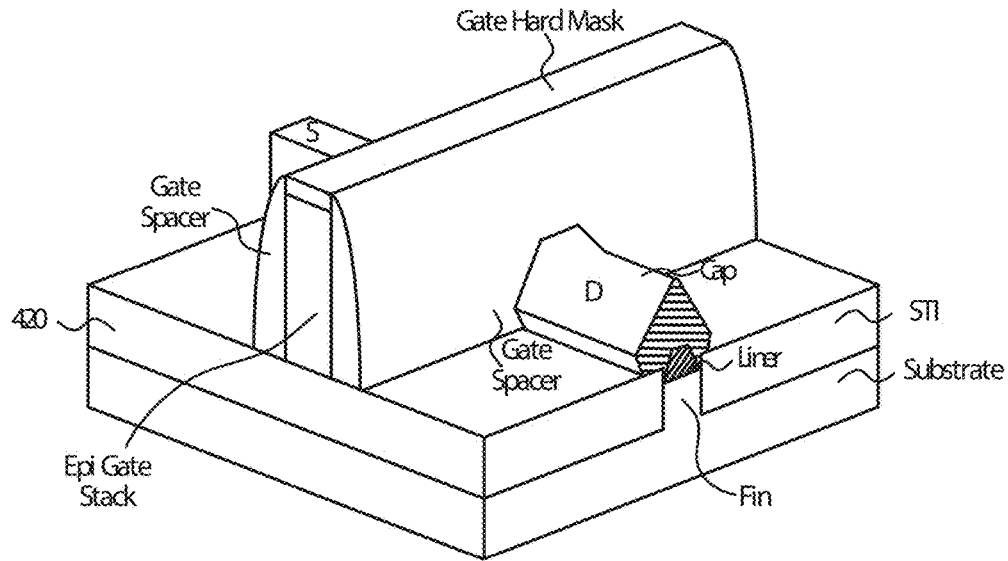
FIGS. 12A-12C each illustrates a perspective view of an integrated circuit device that is configured in accordance with other embodiments of the present disclosure.

The source/drain regions can be formed in the originally provided fin structure in some embodiments. Alternatively, in other embodiments, the source/drain regions are formed by an etch-and-replace process. For instance, FIG. 12A illustrates an example transistor structure after growth of an epitaxial source/drain liner and cap configuration in the source/drain regions. The epitaxial liner may be, for example, a thin p-type silicon-containing (e.g., silicon or SiGe having 70 atomic % silicon) liner, or a pure germanium (e.g., a separate layer of germanium, or a non-detectable layer that is integrated or otherwise included in the composition of the caps). The epitaxial cap can be, for example, p-type and comprise primarily germanium but may contain less than 20 atomic % tin, according to some embodiments. Other embodiments may have a single layer source/drain configuration rather than a bi-layer structure, or some other desired configuration. Numerous other source/drain configurations and material system can be used, as will be appreciated.

As will further be appreciated, note that an alternative to the tri-gate configuration as shown is a double-gate architecture, which would include a dielectric/isolation layer on top of the fin, such that the gate resides predominately on the two opposing sides of the fin (again, above the STI region). Further note that the example shapes of the epitaxial liner and cap making up the source/drain regions in this example case are not intended to limit the present disclosure to such shapes; rather, other source/drain shapes will be apparent in light of this disclosure (e.g., round, square or rectangular source/drain regions may be implemented, whether they be raised, flush, or recessed relative to the top of the channel layer).

Figure 12B:
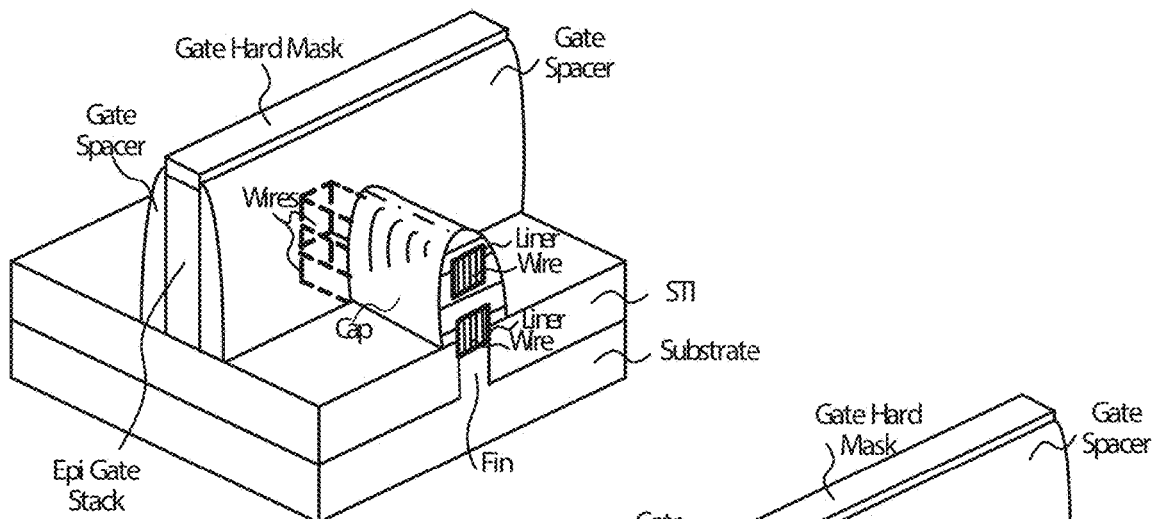

FIG. 12B shows a perspective view of a nanowire transistor structure formed in accordance with one embodiment of the present disclosure. A nanowire transistor (sometimes referred to as gate-all-around FET) is configured similarly to a fin-based transistor, but instead of a fin, a nanowire is used and the gate material generally surrounds the channel region on all sides. Depending on the particular design, some nanowire transistors have, for instance, four effective gates. This example embodiment includes two nanowires (generally designated as wire, and intended to include ribbons and nanowires, depending on aspect ratio), although other embodiments can have any number of wires. The nanowires can be implemented, for example, with p-type silicon or germanium or SiGe or III-V nanowires. As can be seen, one nanowire is formed or otherwise provided on a pedestal of the substrate and the other nanowire effectively floats in the source/drain material, which in this example embodiment is a bi-layer construction comprising liner and cap. Single layer constructions may also be used, or any other desired construction. Other embodiments may have a recess in the substrate in which the nanowire is formed (rather than on a pedestal). Just as with the fin configuration in FIG. 12A, note that the nanowires can be replaced in the source/drain regions with a single layer or bi-layer or multi-layer construction of source/drain material (e.g., relatively thin silicon or germanium or SiGe liner and relatively thick high concentration germanium cap). Alternatively, a multi-layer construction can be provided around the originally formed nanowire as shown (where the liner is provided around the nanowire, and the cap is then provided around the liner).

Figure 12C:
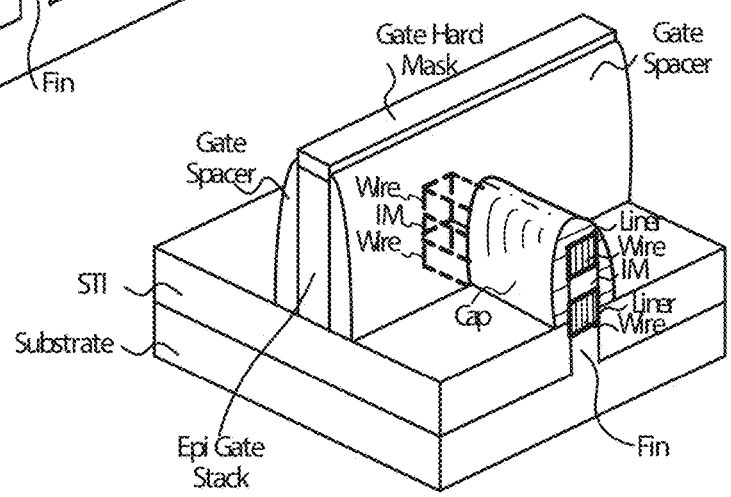

FIG. 12C also illustrates another example nanowire configuration having multiple nanowires, but in this example case, inactive material (IM) is not removed from between the individual nanowires during the nanowire forming process, which can be carried out using various standard techniques. Thus, one nanowire is provided on a pedestal (or recess) of substrate and the other nanowire effectively sits on top of the inactive material. Note the nanowires are active through the channel, but the inactive material is not. As can be seen, the bi-layer source/drain construction of liner and cap is provided around all other exposed surfaces of the nanowires. Again, other embodiments may include single layer construction or some other multi-layer construction.

Example System

Figure 13:
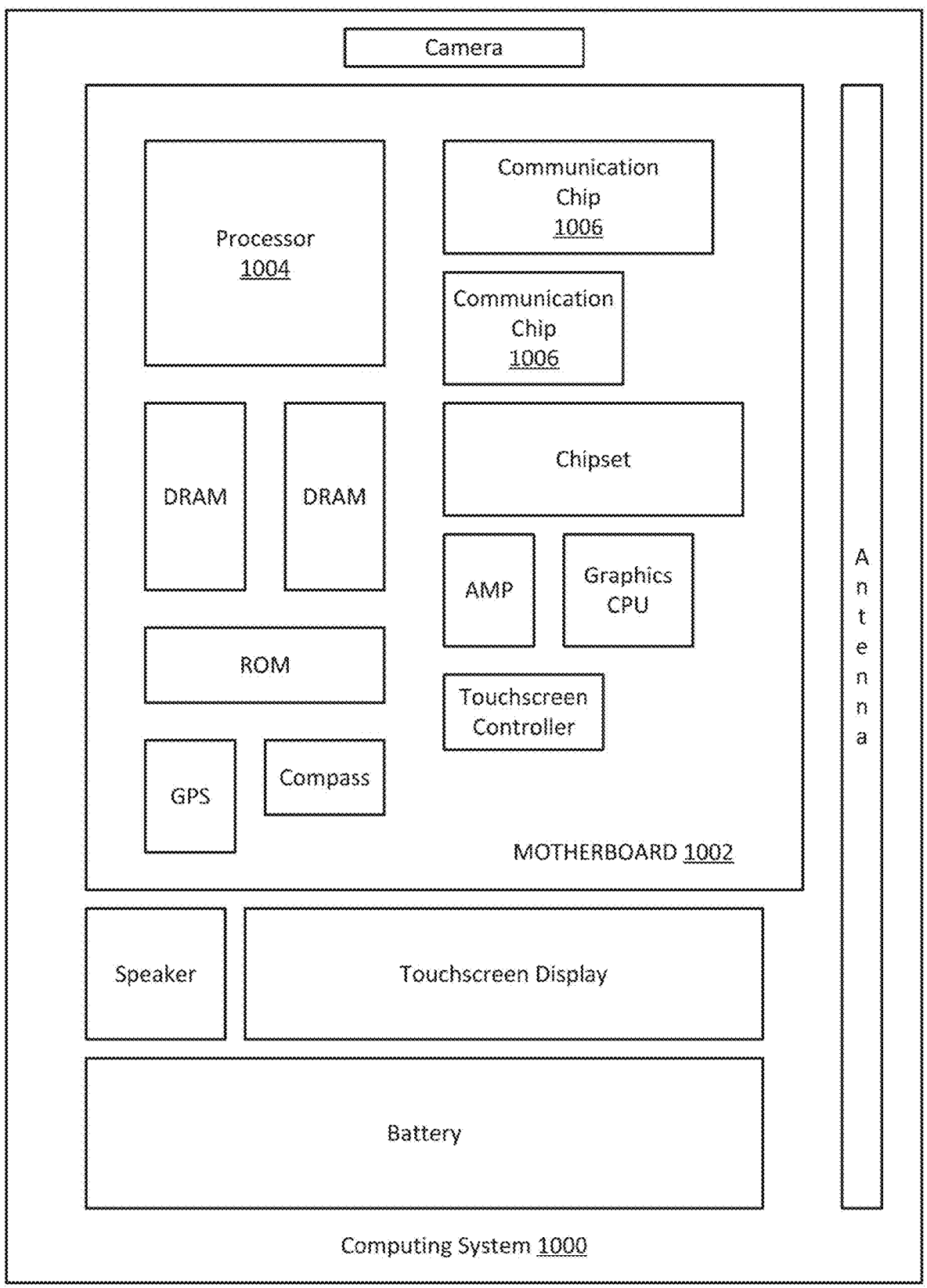
FIG. 13 illustrates a computing system implemented with one or more integrated circuit structures configured in accordance with an embodiment of the present disclosure.

FIG. 13 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006

(two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with fin-based transistors having fin dimensions normally susceptible to fin collapse, as variously explained herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present disclosure, the integrated circuit die of the processor 1004 includes one or more fin-based transistors having high aspect ratio fins pre-treated prior to the transistor forming process as variously provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more fin-based transistors having high aspect ratio fins pre-treated prior to the transistor forming process as variously provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs fin-based transistor devices as described herein (e.g., CMOS devices having both p and n type devices configured with customized channels on the same die). As will be appreciated in light of this disclosure, various embodiments of the present disclosure can be used to improve performance on products fabricated at any process node (e.g., in the micron range, or sub-micron and beyond) by allowing for the use of fin-based transistors having high aspect ratio fins pre-treated prior to transistor forming process as variously provided herein.

FURTHER EXAMPLE EMBODIMENTS

The following examples pertain to further embodiments, from which numerous permutations and configurations will be apparent.

Example 1 is an integrated circuit device, including a substrate, and a first plurality of fins extending from the substrate, each fin having a fin height, a fin width, and a fin length, the fin height including an upper channel portion and a lower sub-fin portion, the fin width being a distance between laterally opposite sidewall surfaces of the fin at the lowermost portion of the channel portion of the fin, and the fin length being longer than the fin width, wherein the fin width is less than 11 nanometers, the fin height is greater than 155 nanometers, and wherein spacing between any two neighboring fins of the plurality is less than 30 nanometers as measured between respective sidewall surfaces of the two neighboring fins at the lowermost portion of the channel portion, and each of the first plurality of fins is in a non-collapsed state.

Example 2 is the device of Example 1, wherein each of the first plurality of fins is a replacement fin in that there is a seam along the height of the fin.

Example 3 is the device of Example 1, wherein each of the first plurality of fins is native to the substrate in that each such fin is a seamless extension of the substrate.

Example 4 is the device of any of the preceding Examples 1-3, further including a second plurality of other fins extending from the substrate.

Example 5 is the device of Example 4, wherein each of the second plurality of fins has a fin height, a fin width, and a fin length, the fin height including an upper channel fin portion and a lower sub-fin portion, the fin width being a distance between laterally opposite sidewall surfaces of the fin at the lowermost portion of the channel portion of the fin, and the fin length being longer than the fin width, wherein the fin width is less than 11 nanometers, the fin height is greater than 155 nanometers, and wherein spacing between any two neighboring fins of the plurality is less than 30 nanometers as measured between respective sidewall surfaces of the two neighboring fins at the lowermost portion of the channel portion, and each of the second plurality of fins is in a non-collapsed state.

Example 6 is the device of Example 4, wherein each of the first plurality of fins include a first semiconductor composition, and each of the second plurality of fins include a second semiconductor composition different from the first semiconductor composition.

Example 7 is the device of any of the preceding Examples, wherein at least some of the first plurality of fins has a fin length less than 200 nanometers.

Example 8 is the device of any of the preceding Examples, wherein the channel portion has a height that is greater than 35 nanometers.

Example 9 is the device of any of the preceding Examples, further including a shallow trench isolation on the substrate and opposing sides of the sub-fin portion of each of the first plurality of fins, a gate stack over each channel portion, the gate stack including a gate dielectric and a gate electrode, and source and drain regions corresponding to each channel portion.

Example 10 is the device of any of Examples 1-8, further including a shallow trench isolation (STI) material on the substrate and between fins of the first plurality, the STI material having a height to just below the lowermost portion of the channel portion of the fins so as to cover the sub-fin portion but not the channel portion, a gate electrode over the channel portion of each of the fins, a gate dielectric positioned between the gate electrode and the channel portion of each of the fins, and a source region and a drain region each at least one of on and in each of the first plurality of fins and adjacent the corresponding channel portion, such that the corresponding channel portion is between the source and drain regions.

Example 11 is the device of any of the preceding Examples, wherein the substrate is a multi-layer substrate having one or more semiconductor layers, and the first plurality of fins are formed from at least one of the one or more semiconductor layers.

Example 12 is the device of Example 11, wherein the multi-layer substrate includes one or more insulator layers between the one or more semiconductor layers.

Example 13 is the device of any of the preceding Examples, wherein each fin includes a channel portion that includes one or more nanowires, each nanowire formed from a corresponding one of the one or more semiconductor layers.

Example 14 is the device of any of the preceding Examples, further including a gate stack over each channel portion, the gate stack including a gate dielectric and a gate electrode, and source and drain regions corresponding to each channel portion.

Example 15 is a system-on-chip including the device of any of any of the preceding Examples.

Example 16 is a computing system including the integrated circuit structure of any of any of the Examples 1-14.

Example 17 is an integrated circuit device, including a substrate, and a first plurality of fins extending from the substrate, each fin having a fin height, a fin width, and a fin length, the fin height including an upper channel portion and a lower sub-fin portion, the fin width being a distance between laterally opposite sidewall surfaces of the fin at the lowermost portion of the channel portion of the fin, and the fin length being longer than the fin width, wherein the fin width is less than 15 nanometers, the fin height is greater than 190 nanometers, and wherein spacing between any two neighboring fins of the plurality is less than 30 nanometers as measured between respective sidewall surfaces of the two neighboring fins at the lowermost portion of the channel portion, and each of the first plurality of fins is in a non-collapsed state.

Example 18 is the device of Example 17, wherein each of the first plurality of fins is a replacement fin in that there is a seam along the height of the fin.

Example 19 is the device of Example 17, wherein each of the first plurality of fins is native to the substrate in that each such fin is a seamless extension of the substrate.

Example 20 is the device of any of Examples 17-19, further including a second plurality of other fins extending from the substrate.

Example 21 is the device of Example 20, wherein each of the second plurality of fins has a fin height, a fin width, and a fin length, the fin height including an upper channel fin portion and a lower sub-fin portion, the fin width being a distance between laterally opposite sidewall surfaces of the fin at the lowermost portion of the channel portion of the fin, and the fin length being longer than the fin width, wherein the fin width is less than 15 nanometers, the fin height is greater than 190 nanometers, and wherein spacing between any two neighboring fins of the plurality is less than 30 nanometers as measured between respective sidewall surfaces of the two neighboring fins at the lowermost portion of the channel portion, and each of the second plurality of fins is in a non-collapsed state.

Example 22 is the device of any of Examples 20-21, wherein each of the first plurality of fins include a first semiconductor composition, and each of the second plurality of fins include a second semiconductor composition different from the first semiconductor composition.

Example 23 is the device of any of Examples 17-22, wherein at least some of the first plurality of fins has a fin length less than 200 nanometers.

Example 24 is the device of any of Examples 17-23, wherein the channel portion has a height that is greater than 35 nanometers.

Example 25 is the device of any of Examples 17-24, further including a shallow trench isolation on the substrate and opposing sides of the sub-fin portion of each of the first plurality of fins, a gate stack over each channel portion, the gate stack including a gate dielectric and a gate electrode, and source and drain regions corresponding to each channel portion.

Example 26 is the device of any of Examples 17-24, further including a shallow trench isolation (STI) material on the substrate and between fins of the first plurality, the STI material having a height to just below the lowermost portion of the channel portion of the fins so as to cover the sub-fin portion but not the channel portion, a gate electrode over the channel portion of each of the fins, a gate dielectric positioned between the gate electrode and the channel portion of each of the fins, and a source region and a drain region each at least one of on and in each of the first plurality of fins and adjacent the corresponding channel portion, such that the corresponding channel portion is between the source and drain regions.

Example 27 is the device of any of Examples 17-26, wherein the substrate is a multi-layer substrate having one or more semiconductor layers, and the first plurality of fins are formed from at least one of the one or more semiconductor layers.

Example 28 is the device of Example 27, wherein the multi-layer substrate includes one or more insulator layers between the one or more semiconductor layers.

Example 29 is the device of any of Examples 17-28, wherein each fin includes a channel portion that includes one or more nanowires, each nanowire formed from a corresponding one of the one or more semiconductor layers.

Example 30 is the device of any of Examples 17-29, further including a gate stack over each channel portion, the gate stack including a gate dielectric and a gate electrode, and source and drain regions corresponding to each channel portion.

Example 31 is a system-on-chip including the device of any of Examples 17 through 30.

Example 32 is a computing system including the integrated circuit structure of any of Examples 17 through 30.

Example 33 is an integrated circuit device, including a substrate, and a first plurality of fins extending from the substrate, each fin having a fin height, a fin width, and a fin length, the fin height including an upper channel portion and a lower sub-fin portion, the fin width being a distance between laterally opposite sidewall surfaces of the fin at the lowermost portion of the channel portion of the fin, and the fin length being longer than the fin width, wherein the fin width is less than 5 nanometers, the fin height is greater than 80 nanometers, and wherein spacing between any two neighboring fins of the plurality is less than 30 nanometers as measured between respective sidewall surfaces of the two neighboring fins at the lowermost portion of the channel portion, and each of the first plurality of fins is in a non-collapsed state.

Example 34 is the device of Example 33, further including a second plurality of other fins extending from the substrate.

Example 35 is the device of Example 34, wherein each of the second plurality of fins has a fin height, a fin width, and a fin length, the fin height including an upper channel fin portion and a lower sub-fin portion, the fin width being a distance between laterally opposite sidewall surfaces of the fin at the lowermost portion of the channel portion of the fin, and the fin length being longer than the fin width, wherein the fin width is less than 5 nanometers, the fin height is greater than 80 nanometers, and wherein spacing between any two neighboring fins of the plurality is less than 30 nanometers as measured between respective sidewall surfaces of the two neighboring fins at the lowermost portion of the channel portion, and each of the second plurality of fins is in a non-collapsed state.

Example 36 is the device of any of Examples 33-35, wherein at least some of the first plurality of fins has a fin length less than 200 nanometers.

Example 37 is the device of any of Examples 33-36, wherein the channel portion has a height that is greater than 35 nanometers.

Example 38 is the device of any of Examples 33-37, further including a shallow trench isolation on the substrate and opposing sides of the sub-fin portion of each of the first plurality of fins, a gate stack over each channel portion, the gate stack including a gate dielectric and a gate electrode, and source and drain regions corresponding to each channel portion.

Example 39 is an integrated circuit device, including a substrate, and a first plurality of fins extending from the substrate, each fin having a fin height, a fin width, and a fin length, the fin height including an upper channel portion and a lower sub-fin portion, the fin width being a distance between laterally opposite sidewall surfaces of the fin at the lowermost portion of the channel portion of the fin, and the fin length being longer than the fin width, wherein the fin width is less than 5 nanometers, the fin height is greater than 100 nanometers, and wherein spacing between any two neighboring fins of the plurality is less than 50 nanometers as measured between respective sidewall surfaces of the two neighboring fins at the lowermost portion of the channel portion, and each of the first plurality of fins is in a non-collapsed state.

Example 40 is the device of Example 39, further including a second plurality of other fins extending from the substrate.

Example 41 is the device of Example 39, wherein each of the second plurality of fins has a fin height, a fin width, and a fin length, the fin height including an upper channel fin portion and a lower sub-fin portion, the fin width being a distance between laterally opposite sidewall surfaces of the fin at the lowermost portion of the channel portion of the fin, and the fin length being longer than the fin width, wherein the fin width is less than 5 nanometers, the fin height is greater than 100 nanometers, and wherein spacing between any two neighboring fins of the plurality is less than 50 nanometers as measured between respective sidewall surfaces of the two neighboring fins at the lowermost portion of the channel portion, and each of the second plurality of fins is in a non-collapsed state.

Example 42 is the device of any of Examples 39-41, wherein at least some of the first plurality of fins has a fin length less than 200 nanometers.

Example 43 is the device of any of Examples 39-42, wherein the channel portion has a height that is greater than 35 nanometers.

Example 44 is the device of any of Examples 39-43, further including a shallow trench isolation on the substrate and opposing sides of the sub-fin portion of each of the first plurality of fins, a gate stack over each channel portion, the gate stack including a gate dielectric and a gate electrode, and source and drain regions corresponding to each channel portion.

Example 45 is an integrated circuit device, including a substrate, and a first plurality of fins extending from the substrate, each fin having a fin height, a fin width, and a fin length, the fin height including an upper channel portion and a lower sub-fin portion, the fin width being a distance between laterally opposite sidewall surfaces of the fin at the lowermost portion of the channel portion of the fin, and the fin length being longer than the fin width, wherein the fin width is less than 11 nanometers, the fin height is greater than 190 nanometers, and wherein spacing between any two neighboring fins of the plurality is less than 50 nanometers as measured between respective sidewall surfaces of the two neighboring fins at the lowermost portion of the channel portion, and each of the first plurality of fins is in a non-collapsed state.

Example 46 is the device of Example 45, further including a second plurality of other fins extending from the substrate.

Example 47 is the device of Example 45, wherein each of the second plurality of fins has a fin height, a fin width, and a fin length, the fin height including an upper channel fin portion and a lower sub-fin portion, the fin width being a distance between laterally opposite sidewall surfaces of the fin at the lowermost portion of the channel portion of the fin, and the fin length being longer than the fin width, wherein the fin width is less than 11 nanometers, the fin height is greater than 190 nanometers, and wherein spacing between any two neighboring fins of the plurality is less than 50 nanometers as measured between respective sidewall surfaces of the two neighboring fins at the lowermost portion of the channel portion, and each of the second plurality of fins is in a non-collapsed state.

Example 48 is the device of any of Examples 45-47, wherein at least some of the first plurality of fins has a fin length less than 200 nanometers.

Example 49 is the device of any of Examples 45-48, wherein the channel portion has a height that is greater than 35 nanometers.

Example 50 is the device of any of Examples 45-49, further including a shallow trench isolation on the substrate and opposing sides of the sub-fin portion of each of the first plurality of fins, a gate stack over each channel portion, the gate stack including a gate dielectric and a gate electrode, and source and drain regions corresponding to each channel portion.

Example 51 is a method for forming a fin-based transistor structure, the method including forming a plurality of fins on a substrate, each fin extending from the substrate, and treating the plurality of fins on the substrate with at least one of: a self-assembled monolayer; a non-polar solvent; and a surfactant.

Example 52 is the method of Example 51, further including providing insulation material on opposing sides of each fin, so as to leave a top portion of the fins exposed, and forming a gate stack over a channel region of at least one of the fins, forming source and drain regions adjacent the channel region, and forming source and drain contacts on the source and drain regions, respectively.

Example 53 is the method of any of Examples 51-52, wherein treating the plurality of fins on the substrate includes spraying the self-assembled monolayer onto the plurality of fins on the substrate.

Example 54 is the method of any of Examples 51-53, wherein treating the plurality of fins on the substrate includes submerging the plurality of fins on the substrate into a solution including the self-assembled monolayer.

Example 55 is the method of any of Examples 51-54, wherein treating the plurality of fins on the substrate includes treating with the self-assembled monolayer, and the self-assembled monolayer includes a head group, a tail, and a functional group, wherein the head group includes silane, ammonia and/or germane, the tail group includes butane, propane and/or carbon, and the functional group includes glycerol, hydroxide, and/or fluorine/fluoride.

Example 56 is the method of any of Examples 51-54, wherein treating the plurality of fins on the substrate includes treating with the self-assembled monolayer, and the self-assembled monolayer includes a head group, a tail, and a functional group, wherein the head group includes methyl gallium, methyl aluminum, and/or ammonia, the tail group includes butane, propane and/or carbon, and the functional group includes glycerol, hydroxide, and/or fluorine/fluoride.

Example 57 is the method of any of Examples 51-54, wherein treating the plurality of fins on the substrate includes treating with the self-assembled monolayer, and the self-assembled monolayer includes a head group, a tail, and a functional group, wherein the tail group includes butane, propane and/or carbon, and the functional group includes glycerol, hydroxide, and/or fluorine/fluoride.

Example 58 is the method of any of Examples 51-57, wherein treating the plurality of fins on the substrate includes treating with the non-polar solvent, and the non-polar solvent is at least one of isopropyl alcohol, ethanol and hexane.

Example 59 is the method of any of Examples 51-58, wherein treating the plurality of fins on the substrate includes spraying the non-polar solvent onto the plurality of fins on the substrate.

Example 60 is the method of any of Examples 51-59, wherein treating the plurality of fins on the substrate includes submerging the plurality of fins on the substrate into a solution including the non-polar solvent.

Example 61 is the method of any of Examples 51-60, wherein treating the plurality of fins on the substrate includes treating with the surfactant, and the surfactant is an ammonia based solution.

Example 62 is the method of any of Examples 51-61, wherein treating the plurality of fins on the substrate includes spraying the surfactant onto the plurality of fins on the substrate.

Example 63 is the method of any of Examples 51-62, wherein treating the plurality of fins on the substrate includes submerging the plurality of fins on the substrate into a solution including the surfactant.

Example 64 is the method of any of Examples 51-63, wherein treating the plurality of fins on the substrate includes treating with at least two of the surfactant, the non-polar solvent, and the self-assembled monolayer.

Example 65 is the method of any of Examples 51-64, wherein treating the plurality of fins on the substrate includes treating with each of the surfactant, the non-polar solvent, and the self-assembled monolayer.

Example 66 is an integrated circuit device, including a plurality of fins extending from a substrate, each fin having a fin height, a fin width, and a fin length, wherein each fin further includes a channel portion and a sub-fin portion, wherein the fin height includes the height of the channel portion and the height of the sub-fin portion, the fin width being a distance between laterally opposite sidewall surfaces of the fin at the lowermost portion of the channel portion of the fin, and the fin length is longer than the fin width, wherein the fin width is less than 11 nanometers, the fin height is greater than 155 nanometers, wherein spacing between any two neighboring fins of the plurality is less than 30 nanometers as measured between respective sidewall surfaces of the two neighboring fins at the lowermost portion of the channel portion, and wherein each of the plurality of fins is in a non-collapsed state, a gate dielectric on the channel portion of each of the fins, including a top of each fin and the laterally opposite sidewalls not covered by insulation material, and a source region and a drain region each adjacent the corresponding channel portion, such that the corresponding channel portion is between the source and drain regions.

Example 67 is the device of Example 66, wherein at least some of the fins have a fin length less than 200 nanometers.

Example 68 is the device of any of Examples 66-67, wherein the channel portion of at least some of the fins includes nanowires.

Example 69 is a system-on-chip including the device of any of Examples 66-68.

Example 70 is a computing system including the integrated circuit of any of Examples 66-68.

The foregoing description of example embodiments of the disclosure has been presented for the purposes of illustration and description. It is not intended to be exhaustive or to limit the disclosure to the precise forms disclosed. Many modifications and variations are possible in light of this disclosure. For instance, while the techniques are discussed primarily in the context of forming transistors such as FETs, other devices can be made as well such as diodes, variable capacitors, dynamic resistors, etc. It is intended that the scope of the disclosure be limited not by this detailed description, but rather by the claims appended hereto.

What is claimed is:

1. An integrated circuit device, comprising:
   a substrate;
   a first fin and a second fin extending from the substrate, wherein each of the first and second fins includes a lower portion and an upper portion; and
   isolation material adjacent at least the lower portions of the first and second fins;
   wherein each of the first and second fins is in a non-collapsed state, wherein a horizontal width of each of the first and second fins is a distance between sidewall surfaces of the fin at the bottom of the upper portion of the fin, the horizontal width of the first and second fins is less than 11 nm, wherein a vertical total height, for each of the first and second fins, is a sum of a first height of the lower portion of the fin and a second height of the upper portion of the fin, the vertical total height each of the first and second fins is greater than 200 nm, and wherein a horizontal spacing between the first and second fins is less than 53 nm as measured between respective sidewall surfaces of the first and second fins at the respective bottoms of the upper portions of the first and second fins.

2. The integrated circuit device of claim 1, wherein the second height of the upper portion of at least one of the first and/or second fins is greater than 20 nm.

3. The integrated circuit device of claim 1, wherein the second height of the upper portion of at least one of the first and/or second fins is greater than 35 nm.

4. The integrated circuit device of claim 1, wherein the second height of the upper portion of at least one of the first and/or second fins is in the range of 20-75 nm.

5. The integrated circuit device of claim 1, wherein:
   the first fin has a horizontal length that is greater than the horizontal width of the first fin; and
   the horizontal length of the first fin is less than 200 nm.

6. The integrated circuit device of claim 1, wherein one or both of the first and second fins includes alternating layers of compositionally diverse material, to provide a nanowire or nanoribbon configuration.

7. The integrated circuit device of claim 1, further comprising:
   for each of the first and second fins, a corresponding gate stack over and on one or more side walls of the upper portion of the fin, the gate stack including a gate electrode and a gate dielectric, gate dielectric between the gate electrode and the upper portion of the fin.

8. The integrated circuit device of claim 7, further comprising:
   for each of the first and second fins, a corresponding source region and a corresponding drain region, such that the upper portion of the corresponding fin that is under the corresponding gate stack is also laterally between the corresponding source and drain regions; and
   for each of the first and second fins, a corresponding source contact and a corresponding drain contact on the corresponding source and drain regions.

9. An integrated circuit device, comprising:
   a substrate;
   a gate structure; and
   a first structure and a second structure each extending from the substrate, wherein each of the first and second structures is in a non-collapsed state, wherein each of the first and second structures includes a respective lower portion and an upper portion, wherein each of the first and second structures comprises a single semiconductor material continuous from a bottom of the lower portion to a top of the upper portion, wherein the gate structure is above and on sidewalls of the upper portion of each of the first and second structures, wherein a horizontal width of each structure is a distance between opposite sidewall surfaces of the respective structure at the bottom of the upper portion of the structure, wherein the horizontal width of each of the first and second structures is less than 5 nm, wherein a horizontal spacing between the first and second structures is less than 30 nm as measured between respective sidewall surfaces of the first and second structures at the respective bottoms of the upper portions of the first and second structures, and wherein a vertical total height of each of the first and second structures is a sum of a first height of the lower portion of the respective structure and a second height of the upper portion of the respective structure, and wherein the vertical total height of each of the first and second structure is greater than 200 nm.

10. The integrated circuit device of claim 9, wherein the first structure is a replacement fin in that there is a seam between the substrate and the first structure.

11. The integrated circuit device of claim 9, wherein the first structure is native to the substrate in that the first structure is a seamless extension of the substrate.

12. The integrated circuit device of claim 9, wherein the first and second structures comprise one or more group IV semiconductor material.

13. The integrated circuit device of claim 12, wherein the one or more group IV semiconductor material comprises one or more of silicon and germanium.

14. The integrated circuit device of claim 9, wherein the first and second structures comprise one or more group III-V semiconductor material.

15. The integrated circuit device of claim 14, wherein the one or more group III-V semiconductor material comprises one or more of silicon and germanium.

16. The integrated circuit device of claim 9, further comprising:
    isolation material on the substrate, the isolation material on opposing sides of the lower portion of each of the first and second structures, wherein the upper portion of each of the first and second structures extends above the isolation material that is adjacent the lower portions.

17. An integrated circuit device, comprising:
    a substrate;
    a first fin structure and a second fin structure extending from the substrate, wherein each of the first and second fin structures includes a lower portion and an upper portion;
    a gate structure that wraps around a layer included in the first fin structure and/or a layer included in the second fin structure; and
    isolation material adjacent at least the lower portions of the first and second fin structures;
    wherein each of the first and second fin structures is in a non-collapsed state, wherein a horizontal width of each of the first and second fin structures is a distance between sidewall surfaces of the fin structure at the bottom of the upper portion of the fin structure, the horizontal width of the first and second fin structures is less than 12 nm, wherein a vertical total height, for each of the first and second fins, is a sum of a first height of the lower portion of the fin and a second height of the upper portion of the fin, the vertical total height each of the first and second fins is greater than 200 nm, and wherein a horizontal spacing between the first and second fins is less than 50 nm as measured between respective sidewall surfaces of the first and second fins at the respective bottoms of the upper portions of the first and second fins.

18. The integrated circuit device of claim 17, wherein the gate structure wraps around each of two layers included in the first fin structure and/or each of two layers included in the second fin structure.

19. The integrated circuit device of claim 17, wherein the gate structure wraps around each of three layers included in the first fin structure and/or each of three layers included in the second fin structure.

20. The integrated circuit device of claim 17, wherein the gate structure wraps around a layer included in the first fin structure to provide a nanowire or nanoribbon transistor configuration, and/or is on top and side surfaces of the second fin structure to provide a finFET transistor configuration.

* * * * *